United States Patent
Nakasuji et al.

[11] Patent Number: 5,973,333
[45] Date of Patent: Oct. 26, 1999

[54] CHARGED-PARTICLE-BEAM PATTERN-TRANSFER APPARATUS AND METHODS

[75] Inventors: Mamoru Nakasuji, Yokohama; Teruaki Okino, Kamakura, both of Japan

[73] Assignee: Nikon Corporation, Japan

[21] Appl. No.: 09/048,236

[22] Filed: Mar. 25, 1998

[30] Foreign Application Priority Data

Mar. 25, 1997 [JP] Japan .................................. 9-071125

[51] Int. Cl.$^6$ ........................ H01J 37/317; H01J 37/153
[52] U.S. Cl. ............................. 250/492.23; 250/492.22; 250/398
[58] Field of Search ........................ 250/492.23, 492.22, 250/492.2, 398

[56] References Cited

U.S. PATENT DOCUMENTS

| | | | |
|---|---|---|---|
| 5,773,837 | 6/1998 | Nakasuji | 250/492.23 |
| 5,773,838 | 6/1998 | Nakasuji | 250/492.23 |

OTHER PUBLICATIONS

Idesawa et al., "Discontinuity reduction method in pattern connection", *J. Vac. Sci. Tech.* 19(4), 983–987, Nov./Dec. 1981.

*Primary Examiner*—Jack I. Berman
*Attorney, Agent, or Firm*—Klarquist Sparkman Campbell Leigh & Whinston, LLP

[57] ABSTRACT

Charged-particle-beam projection-microlithography apparatus and methods are disclosed for transferring a reticle pattern image to a substrate using a charged-particle beam. The apparatus comprises, along an optical axis in the trajectory direction of the charged-particle beam, a beam emitter for emitting the charged-particle beam toward the mask, a beam shaper for shaping the charged-particle beam so as to have a square or rectangular transverse profile and deflectors for directing the charged-particle beam onto the mask. If the beam shaper creates a charged-particle beam having a rectangular transverse profile, the deflectors of the pattern-transfer apparatus of the present invention operate so that the longer sides of the transverse profile of the charged-particle beam extend in a direction perpendicular to the scanning direction. An axisymmetric projection-lens system converges, inverts and reduces the charged-particle beam which has passed through the mask, to form an image of the mask pattern on a substrate.

32 Claims, 12 Drawing Sheets

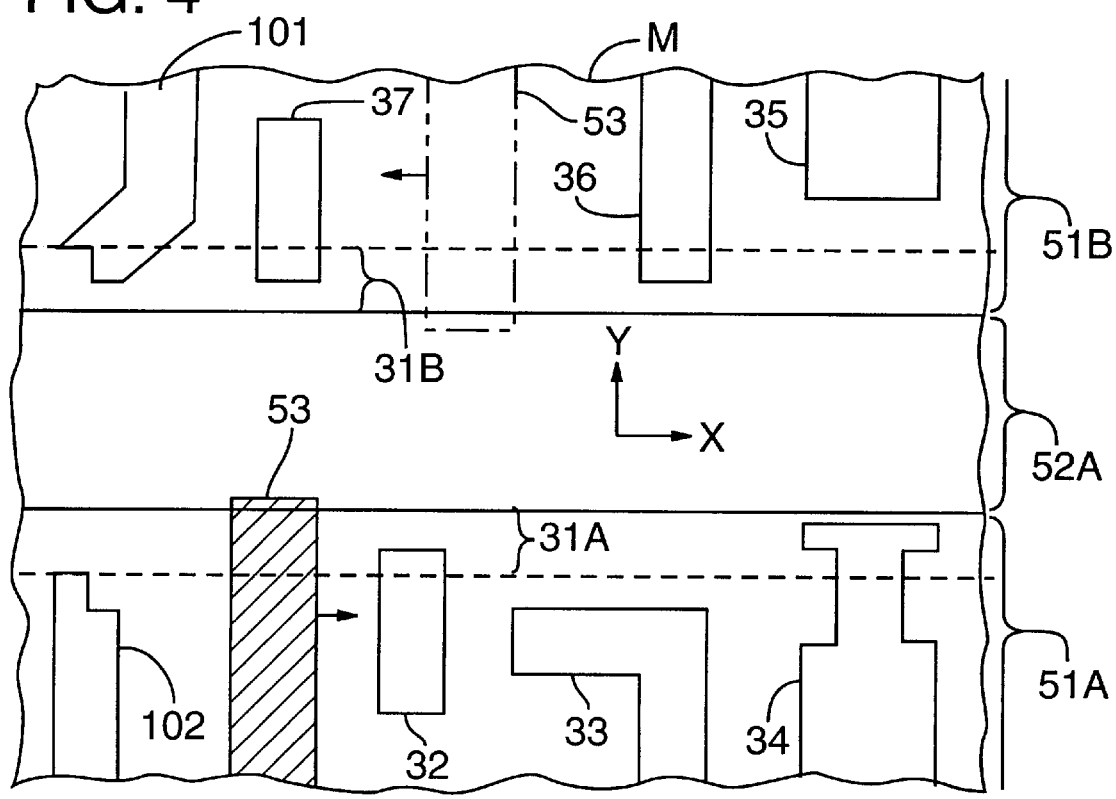
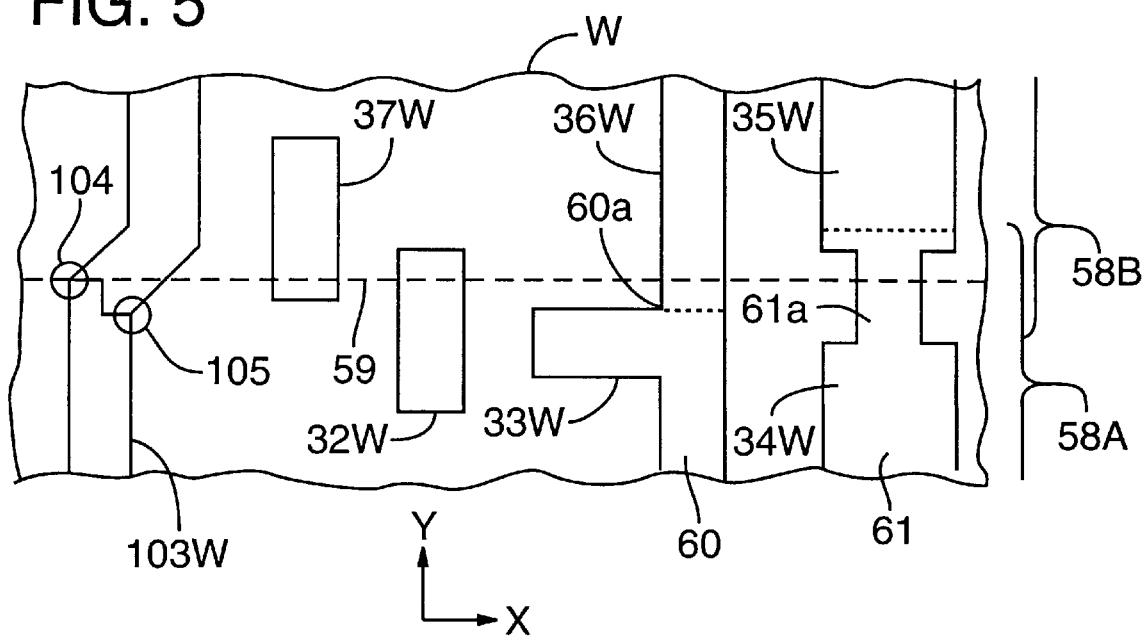

L > G

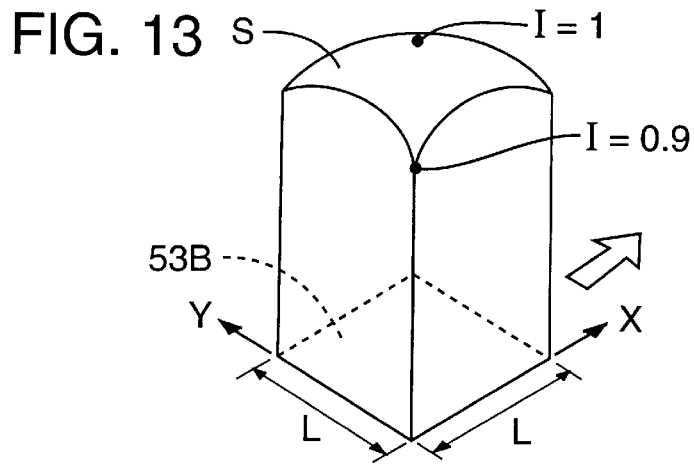
FIG. 13
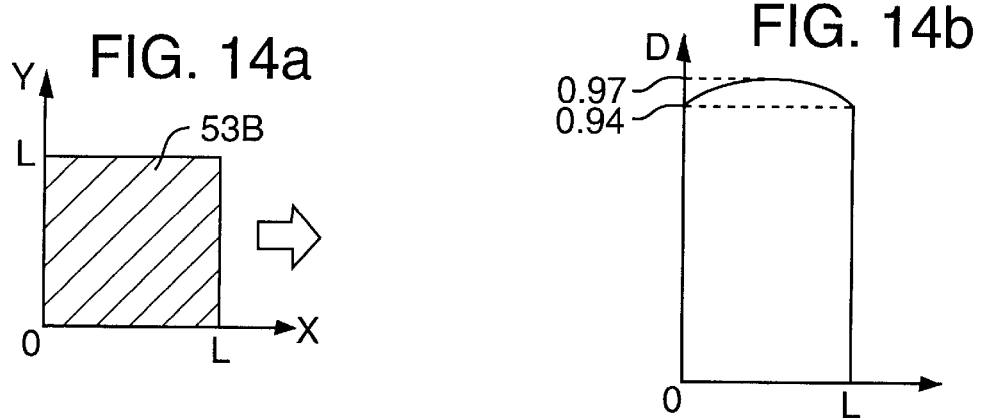
FIG. 14a
FIG. 14b
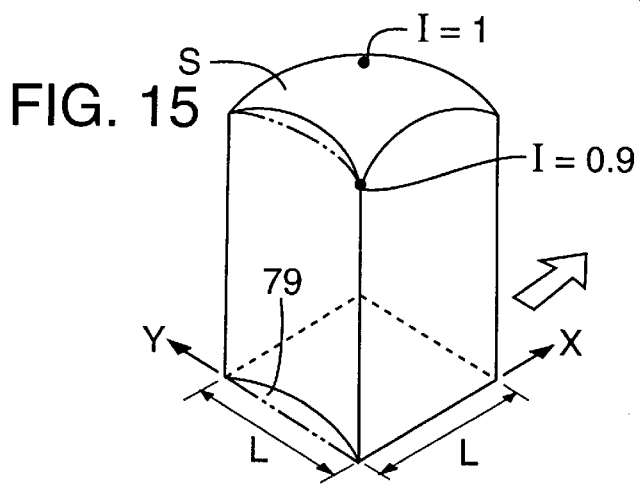
FIG. 15
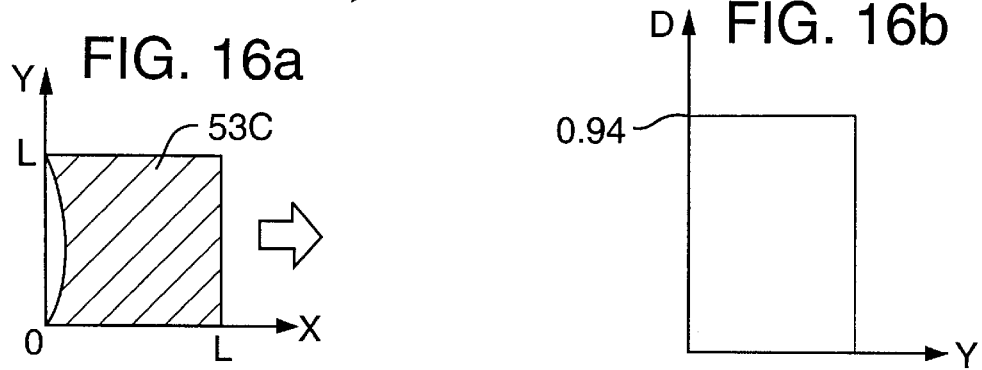
FIG. 16a
FIG. 16b

CHARGED-PARTICLE-BEAM PATTERN-TRANSFER APPARATUS AND METHODS

FIELD OF INVENTION

The invention relates to charged-particle-beam projection microlithography apparatus and methods for transferring a pattern, as defined by a reticle or mask, onto a substrate. The apparatus of the present invention is especially suitable for transferring high-density, minute patterns onto a semiconductor wafer.

BACKGROUND OF THE INVENTION

In charged-particle-beam (CPB) projection microlithography as used in the fabrication of integrated circuits, a circuit pattern defined by a reticle or mask is irradiated with a charged-particle beam. In recent years, CPB projection-microlithography apparatus ("pattern-transfer apparatus") have been developed to improve both the resolution of a transferred pattern and product throughput (i.e., the number of semiconductor wafers that can be processed per unit time). In "collective" pattern-transfer apparatus one or more entire die patterns formed on a mask are transferred onto a wafer in a single exposure. A "die" is a pattern coextensive with the bounds of an integrated circuit or other device to be transferred onto the wafer (usually multiple dies are exposed at respective locations on the wafer).

It is difficult to create a mask for collective pattern-transfer apparatus that provide the high resolution and circuit densities demanded in recent years. In addition, collective pattern-transfer apparatus have been unable to satisfactorily control the aberrations of the optical system through which the charged-particle beam passes, especially over a large optical field covering one or more die patterns. Consequently, "scanning" pattern-transfer apparatus were proposed (as described, e.g., in Japanese Patent Publication Number 7-32111), in which a pattern to be transferred is divided into multiple field segments (mask subfields). The die pattern image is typically transferred using a "step-and-repeat" transfer scheme in which the individual mask subfields are sequentially transferred to corresponding "transfer subfields" on the wafer. The transfer subfields are produced on the wafer surface in locations relative to each other such that the transfer subfields are "stitched" together in the correct order and alignment to reproduce the entire die pattern on the wafer surface.

Conventional scanning pattern-transfer apparatus using the "step-and-repeat" scheme typically include "reducing" pattern-transfer apparatus. In the reducing pattern-transfer apparatus, a deflector is used to sequentially scan the charged-particle beam along "scan fields" on the mask, wherein each scan field on the mask comprises multiple mask subfields. As a mask scan field is scanned, the pattern segment in each subfield of the scan field is transferred sequentially onto a wafer through a projection-optical system typically having a magnification ratio of less than unity. It is desirable for the projection-optical system to have few aberrations over a large optical field because the pattern segments formed in the subfields of the mask must be transferred onto the wafer with a high degree of precision.

To transfer each of the mask subfields onto the wafer with few aberrations while using a relatively large optical field, a conventional optical system uses a deflector combined with axisymmetric lenses. Such optical systems include Moving Objective Lens (MOL) systems and Projection Lithography with Variable Axis Immersion Lens (PREVAIL) systems. In both types of optical systems, a deflector is used in combination with lenses that are symmetric with respect to the optical axis. The MOL optical system is designed to reduce aberrations in a relatively large optical field by shifting the axis of the objective lens. The PREVAIL optical system is similar to the MOL system, but uses an "in-lens" objective lens, wherein the wafer is situated in the field of the objective lens.

Because in such conventional systems the deflector is asymmetric with respect to the rotational axis (i.e., the optical axis of the projection-optical system), rotationally asymmetric aberrations arise in the pattern image projected onto the wafer. Although these asymmetric aberrations can be electrically corrected, the correction mechanism is complicated and increases the manufacturing cost of the optical system.

In general, conventional scan deflectors for scanning the charged-particle beam along the scan fields on a mask are driven by a signal having a "saw-tooth" waveform. With such conventional scan deflectors, the scanning speed of the charged-particle beam typically decreases slightly as the beam moves in a direction away from the optical axis. As a result, the charged-particle dose to which mask regions are exposed increases with increased deflection of the beam from the optical axis. The resulting distribution of exposure energy (which equals the integral of the charged-particle-beam dose) on the corresponding wafer exposure area is not uniform.

Another problem with conventional scanning apparatus occurs during stitching together of the transfer subfields on the wafer to form complete fields. Such stitching procedures are prone to inaccuracy in the resulting pattern image. In the conventional scanning pattern-transfer apparatus, the pattern segments of adjacent transfer subfields must be precisely aligned relative to each other on the wafer as the pattern on the mask is scanned in the longitudinal direction of the mask scan fields.

In addition, conventional pattern-transfer apparatus generally adjust the focal point (i.e., the image-forming position) of the pattern image projected onto the wafer by regulating the driving current supplied to electromagnetic lenses of the projection optical system. However, because the response speed of conventional electromagnetic lenses is relatively slow, the scanning speed of the electron beam must be reduced whenever the focal point of the projected pattern image is adjusted. This limits the throughput of the pattern-transfer apparatus.

Further, with conventional reducing pattern-transfer apparatus, the intensity of the charged-particle beam fluctuates as the pattern density of the mask subfields varies. Consequently, the charged-particle-beam dose to which the wafer is exposed varies from location to location within a die, reducing the resolution of the transferred pattern image.

In addition, whenever the charged-particle beam source is an electron gun used in a temperature-controlled environment, the transverse intensity distribution of the electron beam varies. The transverse intensity distribution of the electron beam is typically a Gaussian distribution. Any such variation in electron-beam intensity may cause the intensity distribution of the electron beam to fluctuate on the mask surface. If the mask is scanned by an electron beam having a variable intensity distribution, the exposure energy (i.e., the dose of the electron beam) on the wafer surface varies, also reducing the resolution of the transferred pattern image.

SUMMARY OF THE INVENTION

In light of the foregoing deficiencies of the prior art, the present invention provides charged-particle beam projection-microlithography apparatus and methods ("pattern transfer apparatus and methods") for transferring a pattern image, as defined by a reticle or mask, onto a wafer using a charged-particle beam. The pattern-transfer apparatus and methods are capable of transferring reduced-mask patterns onto a wafer with a high degree of precision and with well-controlled aberration.

In general, a pattern-transfer apparatus of the present invention comprises a charged-particle beam source for scanning, in a predetermined scanning direction, a mask or reticle pattern onto a wafer. The apparatus comprises, along an optical axis in the trajectory direction of the charged-particle beam, a charged-particle beam emitter for emitting the charged-particle beam toward a mask or reticle, a beam shaper for shaping the charged-particle beam so as to provide the beam with a rectangular-shaped or square-shaped cross-sectional (transverse) profile, and deflectors for directing the charged-particle beam onto selected subfields of the mask. If the beam shaper creates a charged-particle beam having a rectangular-shaped transverse profile, then the deflectors of the pattern-transfer apparatus of the present invention operate so that the longer sides of the transverse profile of the charged-particle beam extend in a direction perpendicular to the scanning direction. If the beam shaper creates a charged-particle beam having a square-shaped profile, then the transverse profile is sized to be greater than the ripple value of the electron-beam intensity distribution (as described below). The pattern-transfer apparatus further comprises an axis-symmetric projection-lens system that converges, inverts, and reduces the charged-particle beam that passes through the mask pattern, to form an image of the mask pattern on a wafer.

The pattern-transfer apparatus and methods of the present invention operate to maintain constant scan speeds of the charged-particle beam so as to make the distribution of the exposure energy on the wafer uniform during the pattern-transfer process. Additionally, the pattern-transfer apparatus and methods provide relatively rapid adjustment of the focal point of the projected pattern image on the wafer during scanning of the charged-particle beam on the mask by control of the electrical current supplied to electrodes within the projection-lens system.

BRIEF DESCRIPTION OF THE DRAWINGS

FIG. 4 is an enlarged plan view of a mask illustrating a representative pattern arrangement of adjacent subfields on a mask.

FIG. 5 is an enlarged plan view of a wafer onto which the mask pattern shown in FIG. 4 has been transferred.

FIG. 13 illustrates a transverse intensity distribution of an electron beam in a subfield in the pattern-transfer apparatus of FIG. 7.

FIG. 14(a) shows the scan area and the scan direction in the XY plane of the subfield shown in FIG. 13.

FIG. 14(b) is a graph illustrating the integrated exposure energy illuminated on the mask subfield shown in FIG. 13, in the Y-axis direction.

FIG. 15 illustrates a transverse intensity distribution of an electron beam in a subfield, in which the electron beam is shaped so that the trailing face is concave in the Y-axis direction.

FIG. 16(a) shows the scan area and the scan direction in the XY plane of the illumination subfield shown in FIG. 15.

FIG. 16(b) is a graph illustrating the integrated exposure energy illuminated on the subfield shown in FIG. 15.

DETAILED DESCRIPTION OF THE INVENTION

Figure 1:
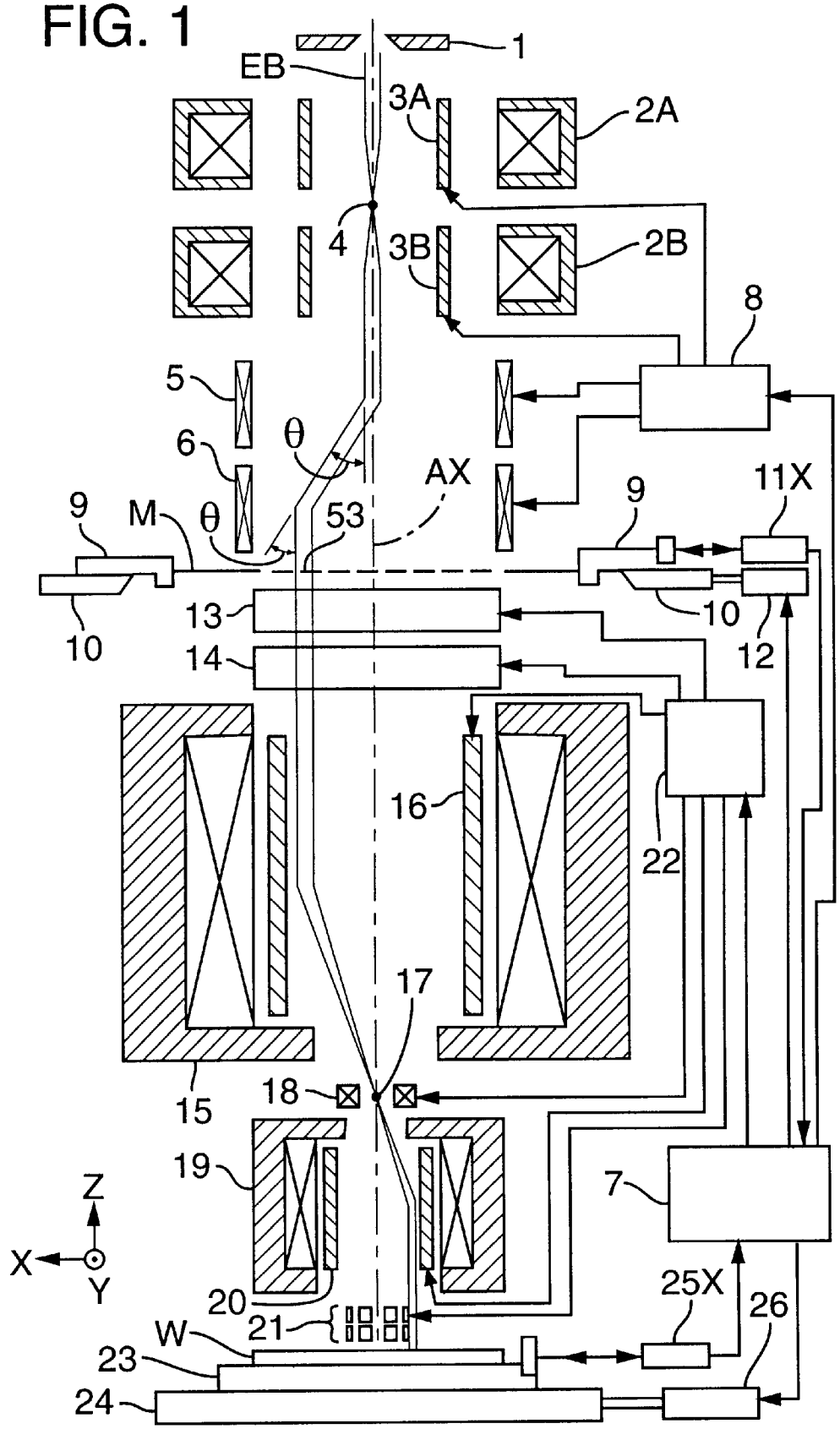
FIG. 1 is a schematic sectional elevational view of the X–Z plane of a first representative embodiment of the pattern-transfer apparatus of the present invention, wherein the charged-particle beam source comprises an electron-beam source.

Referring to FIG. 1, in general, a pattern-transfer apparatus of the present invention comprises a charged-particle beam emitter (not shown but understood to be upstream of the top of the page) for emitting a charged-particle beam toward a mask M, a beam shaper 1 for shaping the charged-particle beam so as to have a square-shaped or rectangular-shaped transverse profile, and a condenser lens system 2A, 2B to both converge the charged-particle beam and make the beam parallel to the optical axis AX. The pattern-transfer apparatus preferably further comprises a pair of electromagnetic deflectors 5, 6 for directing the charged-particle beam onto the mask M so that, if the beam has a rectangular transverse profile, the longer sides of the rectangular profile extend in a direction perpendicular to the scanning direction. Additionally, the deflectors 5, 6 deflect the charged-particle beam so that the beam scans in a predetermined scanning direction on the mask M. The pattern-transfer apparatus further comprises an axisymmetric projection-lens system, e.g., projection lens 15 and objective lens 19, for converging the charged-particle beam that passes through the mask M, so as to form a reduced and inverted image of the mask pattern on a substrate, such as on a wafer W.

For convenience, the present invention is described primarily with reference to use of an electron-beam source, masks, and semiconductor wafers. It will be understood by persons skilled in the art, however, that the apparatus and methods of the present invention apply equally well to other charged-particle beam sources, reticles, and other various semiconductor substrates.

The present invention is further described with reference to three representative embodiments.

First Embodiment

The first representative embodiment of the pattern-transfer apparatus of the present invention preferably uses an electron beam source as the charged-particle beam source for successively scanning mask subfields and transferring the mask subfields onto a wafer W.

Referring to FIG. 1, the Z axis is parallel to the optical axis AX of the optical system, the X axis extends in a direction horizontal with the plane of the paper, and the Y-axis extends in a direction perpendicular to the plane of the paper.

In FIG. 1, an electron beam EB, emitted by an electron gun (not shown, but understood to be upstream of the beam shaper 1) is guided to the beam shaper 1. The beam shaper 1 in the embodiment defines a rectangular-shaped aperture for shaping the electron beam EB to have a rectangular-shaped transverse profile. A first condenser lens 2A is positioned downstream of the beam shaper 1 to converge the electron beam EB at a first crossover 4. A second condenser lens 2B, for collimating the electron beam EB, is positioned downstream of the first condenser lens 2A and the first crossover 4.

The first and second condenser lenses 2A, 2B preferably comprise electromagnetic lenses. Electrodes 3A and 3B, which preferably comprise hollow cylinders made of a conductive material, are positioned inside and coaxially with the condenser lenses 2A, 2B, respectively.

A first deflector 5, preferably an electromagnetic deflector, is positioned downstream of the second condenser lens 2B for deflecting the parallel beam EB in the X-axis direction by an angle θ. A second deflector 6, also preferably an electromagnetic deflector, is positioned downstream of the first deflector 5, for deflecting the electron beam deflected by the first deflector 5 by an angle −θ (in the −X-axis direction). As a result, the parallel electron beam EB is incident upon a subfield on the mask M at approximately a right angle to the plane of the mask.

The deflection angles θ, −θ of the first and second deflectors 5, 6 are controlled by a master controller 7 that controls the overall operation of the pattern-transfer apparatus of the first representative embodiment. Specifically, the master controller 7 controls a first deflection controller 8 that, in turn, supplies an appropriate respective electrical current to the first and second deflectors 5, 6. The electrical current supplied to the first and second deflectors 5, 6 is regulated so that the rate of change of the current is proportional to θ/sin θ, whereby the incident angle of the electron beam EB to the mask M is maintained at approximately a 90° angle relative to the plane of the mask. Whenever the electron beam EB scans a subfield of the mask M in the X-axis direction at a 90° angle (at a constant speed), the distribution of the exposure energy (i.e., the electron dose) of the electron beam is substantially uniform on both the mask M and subsequently, the wafer W.

The mask M is positioned so as to be conjugate with the beam shaper 1. The mask M may comprise any suitable mask material known to those skilled in the art. For example, the mask may be a scattering mask or a stencil mask. A scattering mask typically comprises a thin-film silicon nitride (SiN) pattern that is transmissive to an electron beam, and a tungsten thin-layer pattern that is not transmissive, i.e., the tungsten thin-layer serves as a scattering layer. A stencil mask typically comprises a scattering layer made of silicon, the scattering layer defining openings therethrough to form a desired pattern.

The mask M is mounted on a mask stage 9 so as to be parallel to the XY plane. The mask stage 9, preferably driven by a mask-stage driver 12 connected to a base 10, is movable in a stepwise manner in the X-axis direction and continuously in the Y-axis direction. The position of the mask stage 9 along the X-axis is preferably detected by a first laser interferometer 11X. The first laser interferometer 11X is electrically connected to the master controller 7 to provide data to the master controller 7 indicative of the detected position of the mask stage 9.

Figure 2:
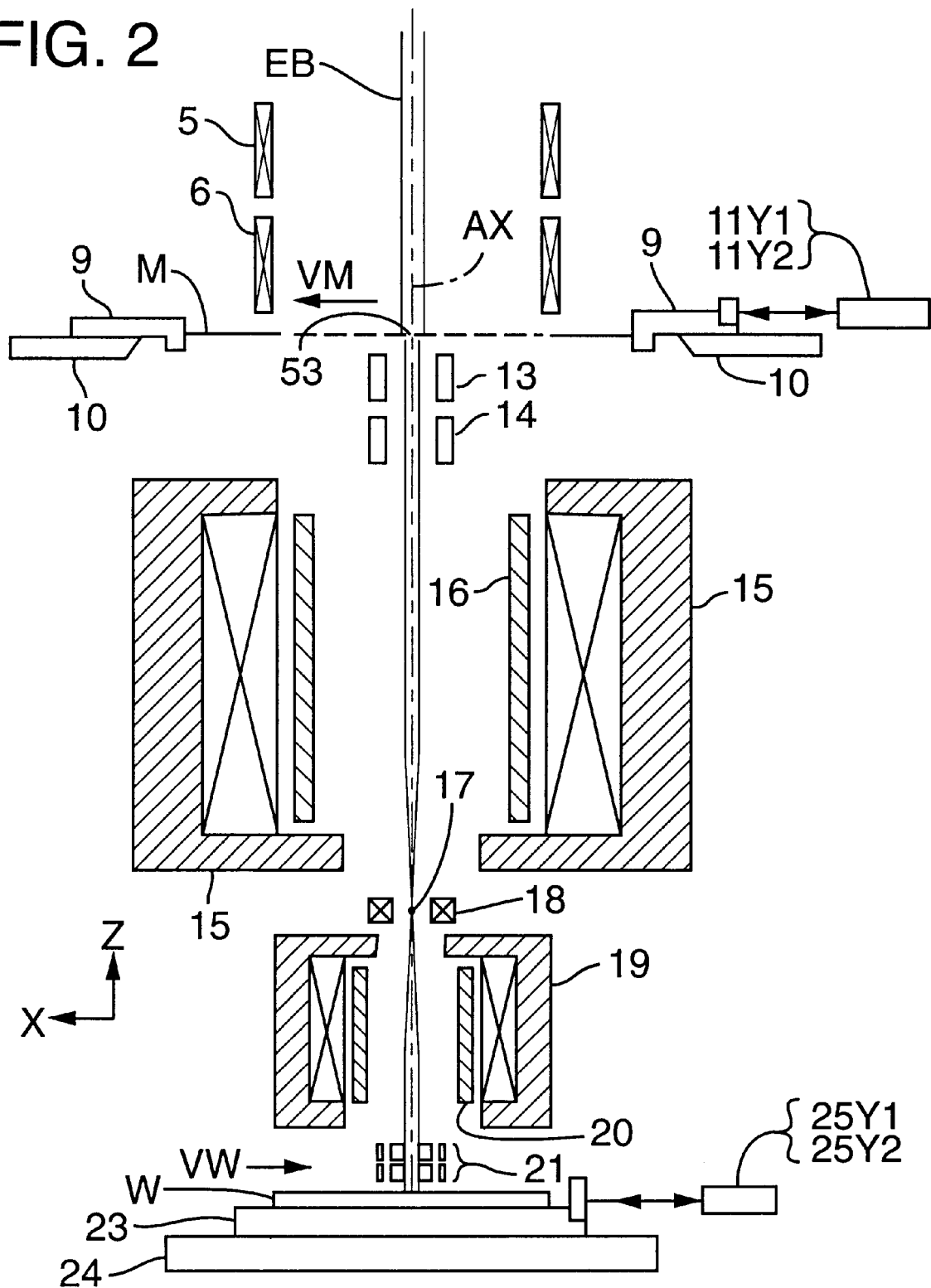
FIG. 2 is a schematic sectional elevational view of the X–Z plane of a portion of the pattern-transfer apparatus of FIG. 1.

FIG. 2 is a view of the Y-Z plane of the pattern-transfer apparatus of FIG. 1. The Y-axis position and the rotational angle of the mask stage 9 are detected by the laser interferometers 11Y1 and 11Y2, respectively. Data indicative of the detected Y-axis position and rotational angle of the mask stage 9 are supplied from the interferometers 11Y1, 11Y2, to the master controller 7.

Figure 3:
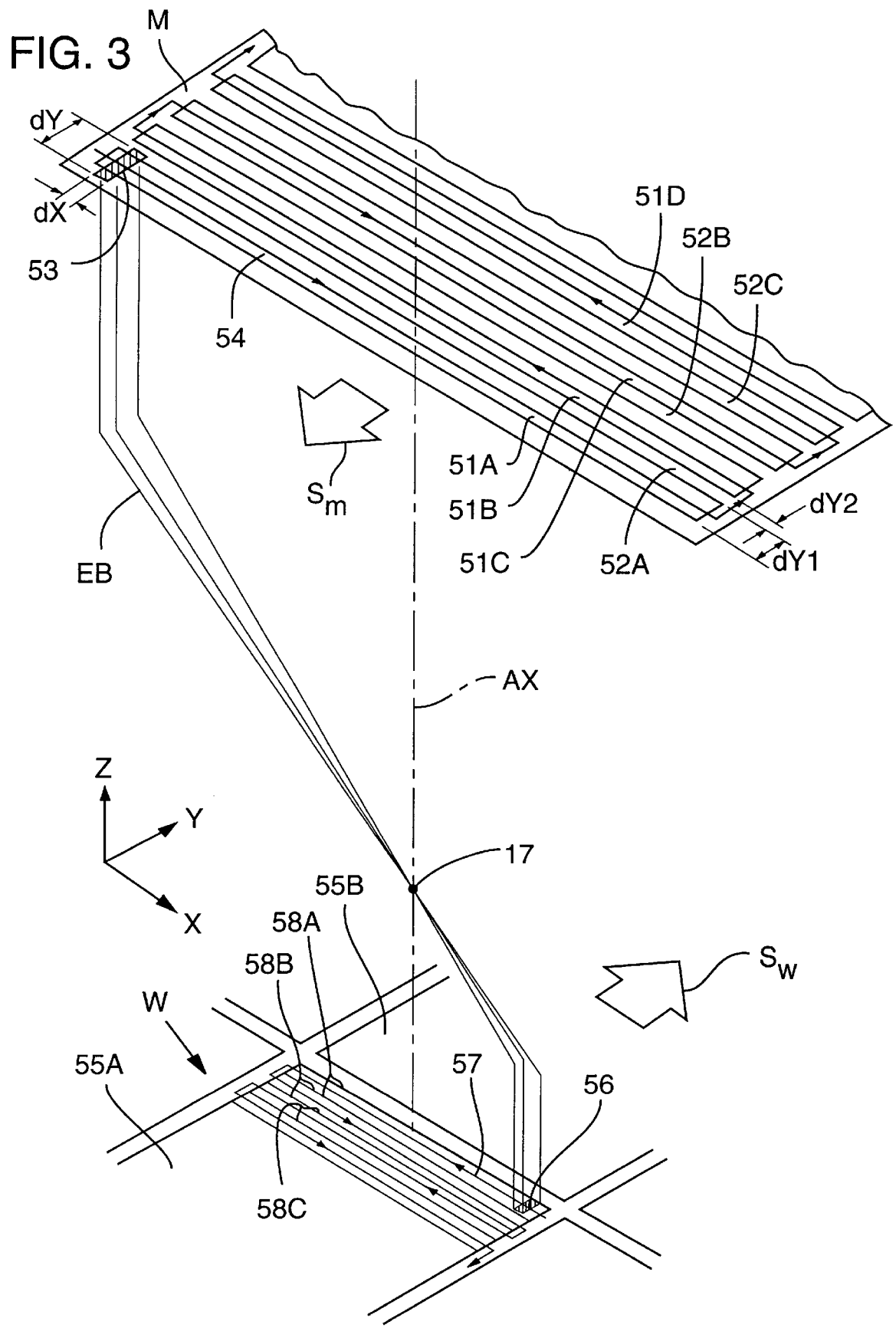
FIG. 3 is a perspective view showing transfer of a mask pattern onto a wafer utilizing the pattern-transfer apparatus of FIG. 1.

The electron-beam EB having a rectangular transverse profile (due to passage through the beam shaper 1) is illuminated on a mask subfield 53 so that the longer sides of the rectangular profile are perpendicular to the longitudinal axis of the subfield on the mask M (FIG. 3). Each subfield on the mask M extends along the X-axis direction.

First and second electrostatic deflectors 13, 14, each preferably comprising a pair of flat conductive plates extending in the X-axis direction, are positioned downstream of the mask M. The first electrostatic deflector 13 deflects the electron beam EB by an angle θ in the Y-axis direction. The second electrostatic deflector 14 deflects the electron beam EB back by the angle −θ. The deflection angles θ, −θ of the first and second electrostatic deflectors 13, 14, respectively, are controlled by the master controller 7 through a second deflection controller 22.

Further with respect to FIG. 1, the pattern-transfer apparatus further comprises an axisymmetric projection-lens system positioned downstream of the first and second electromagnetic deflectors 13, 14. The axisymmetric projection-lens system may comprise, for example, a symmetric-magnetic doublet lens system. Specifically, the axisymmetric projection-lens system preferably comprises a projection lens 15 positioned upstream of an objective lens 19. Both the projection lens 15 and the objective lens 19 preferably comprise the symmetric magnetic doublet lens system. Electrodes 16, 20 preferably comprising hollow cylinders made of a conductive material, are positioned inside the projection lens 15 and the objective lens 19, respectively. The electrodes 16 and 20 are electrically connected to the second deflection controller 22 that is controlled by the master controller 7.

The projection lens 15 converges the electron beam EB, which has passed through the selected subfield 53 of the pattern on the mask M, to form a second crossover 17 on the optical axis AX. At the second crossover 17, the pattern image is inverted. The objective lens 19 reduces the electron beam image by a magnification of β which is less than unity (e.g., ¼). The image of the selected subfield 53 is formed at a reduced magnification on the corresponding transfer subfield on a wafer W. The wafer W is coated with an electron-beam resist film.

The pattern-transfer apparatus of the first representative embodiment further comprises a first octopole electromagnetic deflector 18 (e.g., an astigmatism-correction coil)

positioned around the location of the second crossover 17. The first octopole electromagnetic deflector 18 compensates for astigmatism (i.e., defects in the optical system in which the electron beam fails to converge at the single, second crossover 17), downstream of the projection lens 15 and upstream of the objective lens 19. The first octopole electromagnetic deflector 18 is electrically connected to the second deflection controller 22 for control of the amount of astigmatic compensation.

A pair of octopole electrostatic deflectors 21 are positioned between the objective lens 19 and the wafer W and connected to the second deflection controller 22. The pair of octopole electrostatic deflectors 21 deflect the electron beam EB in the X-axis and Y-axis directions at a high speed. The deflection angles imparted to the electron beam EB by the pair of octopole electrostatic deflectors 21 are controlled by the second deflection controller 22.

The wafer W is preferably held on a sample stage 23 parallel to the XY plane. The sample stage 23 is mounted on a movable stage 24 that is driven by a wafer-stage driver 26. The wafer-stage driver 26 moves the stage 24 in a stepwise manner along the X-axis direction and continuously along the Y-axis direction. The X-axis position of the sample stage 23 is detected by a second laser interferometer 25X that is, in turn, connected to the master controller 7 that receives and stores data from the second laser interferometer 25X indicative of the detected X-axis position. The Y-axis position and the rotational angle of sample stage 23 are detected by laser interferometers 25Y1, 25Y2. Data indicative of the detected Y-axis position of the sample stage 23 are supplied from the interferometers 25Y1, 25Y2, to the master controller 7 for processing and storage as required.

In this embodiment, the mask M and the wafer W are synchronously moved in opposite directions along the Y axis during projection of a mask-subfield pattern through the projection-lens system. The pair of electrostatic deflectors 21 are used to compensate as required for relative vibration between the mask M and the wafer W during scanning, and for any distortion in the projection-lens system.

Returning to FIG. 1, data useful prior to exposing the mask pattern on the wafer W include the mask M pattern density and the layout of the transfer fields of the wafer W. This data is stored by the master controller 7. Based on this data, the master controller 7 controls the scanning speed of the electron beam EB and the focal point of the pattern image by controlling the first and second deflection controllers 8, 22. At the same time, the master controller 7 controls the positions and the drive speeds of the mask stage 9 and the sample stage 23 so that reduced mask-subfield images are formed through the pattern-transfer apparatus onto appropriate transfer subfields on the wafer W.

During operation of the pattern-transfer apparatus of the first representative embodiment, whenever an electron beam EB is emitted from the charged-particle source (not shown), a variable voltage is applied to the first and second electrodes 3A and 3B by the first deflection controller 8. The voltage applied to the electrodes 3A and 3B depends upon the current density of the electron beam EB. In order to make the intensity of the electron beam EB to which the wafer W is exposed uniform, the current density of the electron beam is changed according to the pattern density of the mask M. Specifically, the current density is increased in mask areas having a low-pattern density (i.e., areas having relatively fewer transmissive portions), and the current density is decreased in mask areas having a high-pattern density (i.e., areas having relatively greater transmissive portion). In this manner, any blur or lack of focus of the electron beam EB caused by space-charge effects is reduced.

The focal points of the first and second condenser lenses 2A and 2B can also change as the current density of the electron beam EB is varied. A relatively high electric current level results in a longer focal point. A relatively low electric current level results in a shorter focal point. To avoid variation in focal points, any voltage applied to the first and second electrodes 3A, 3B is regulated according to the current density of the electron beam. Accordingly, the focal points of the first and second condenser lenses 2A, 2B are kept constant. Thus, the conjugate relationship of the beam shaper 1 with the mask M is maintained.

Respective voltages are also applied to the projection-lens electrode 16 and the objective-lens electrode 20 via the second deflection controller 22 as controlled by the master controller 7. The applied voltage levels are preferably the same for both the projection-lens electrode 16 and the objective-lens electrode 20. Accordingly, the focal point of the projection-lens system (i.e., the projection lens 15 and the objective lens 19) is dynamically controlled by changing the voltage applied to their corresponding electrodes 16, 20. The voltage applied to the electrodes 16, 20 is a function of the position of the electron beam EB in the X-axis direction on the mask M. In particular, the voltage applied to the projection-lens electrode 16 is regulated so as to maintain the second crossover 17 at a constant position. The voltage applied to the objective-lens electrode 20 is regulated so as to maintain the projected image at a constant focal point.

More particularly, the electrodes 16, 20 may serve as focal-point-adjusting means for adjusting the focal point of the projection-lens system 15, 19 in response to any time-dependent change in the current density of the electron beam that has passed through the mask M. As the charged-particle beam scans in the scanning direction, the transmissive portion (i.e., the aperture features) of the mask M within the cross-sectional illumination area 53 of the electron beam changes. Accordingly, the space-charge effect (or the current density) of the electron beam that has passed through the mask M changes with time. The focal point shifts slightly away from the projection optical system when the current density increases, and shifts in a direction toward the projection optical system when the current density decreases. Accordingly, the beam current is set as a function of focal point position in the scanning direction so that the resultant current density of the electron beam that has passed through the mask M is constant. By regulating the beam current as a function of the pattern density of the mask M, and by applying a varying voltage to the electrodes 16, 20 in synchrony with beam scanning so as to correspond to the changing beam current, pattern transfer is performed while preserving a stable focal point.

FIG. 3 illustrates how a reduced circuit pattern on a mask M is transferred onto a wafer W (at magnification less than unity). The circuit pattern formed on the mask M is divided into multiple long rectangular scan fields 51A, 51B, etc. Each scan field extends along the X-axis direction and contains a portion of the circuit pattern (e.g., die) to be transferred onto the wafer W. Each scan field contains electron-transmissive regions that define circuit features. Boundary regions 52A, 52B, etc., extend between adjacent scan fields 51A, 51B, etc. The boundary regions 52A, 52B, etc., do not define pattern features and block or scatter the electron beam such that it does not pass through to the wafer W in such areas.

Continuing to refer to FIG. 3, the electron beam EB that passes through the beam shaper 1 and is deflected by the first and second electromagnetic deflectors 5, 6, strikes the scan field 51A on the mask M. The incident electron beam EB illuminates a subfield 53 that extends in the Y-axis direction in the scan field 51A. Electrons of the electron beam EB passing through the scan field 51A strikes a corresponding transfer field 55A on the wafer W at about a right angle relative to the plane of the wafer. A rectangular-shaped transfer subfield 56, corresponding to the mask subfield 53 but reduced in size, is formed on the wafer W.

The electron beam EB is scanned back and forth in the X-axis direction, successively along each scan field 51A, 51B, etc. The length of each scan field 51A, 52A, etc. along the X-axis direction is greater than or equal to the width of the die so that the subsequent stitching portion of adjacent transfer subfields is inconspicuous.

Assuming that the intensity distribution of the charged-particle beam is substantially uniform in the mask subfield 53, it is preferable that the width (dX) of the mask subfield 53 in the scanning direction be $\leq \frac{1}{5}$ of its length (dY) which is perpendicular to the scanning direction. In this range, the same aberration correction conditions apply to the entire mask subfield 53 even if the electron beam scans far from the optical axis in the scanning direction.

More particularly, whenever the length of each scan field 51A, 51B, etc., on the mask M is elongated in the scanning direction, aberrations increase when the beam is deflected a relatively long distance from the optical axis AX. To overcome this problem, the axisymmetric projection-lens system (i.e., the projection lens 15 and the objective lens 19) of the present invention, as shown in FIG. 1, is used. By using the axisymmetric projection-lens system, aberrations arising in the projected image change only as a function of the distance of the electron beam from the optical axis AX.

To adequately correct aberrations, the width dX of the subfield 53 in the X-axis direction (i.e., the scanning direction) on the mask M is relatively small, preferably less than or equal to $\frac{1}{5}$ of the length dY of the subfield 53. Accordingly, even if a mask subfield 53 is located at a far end of the scanning path in the X-axis direction (i.e., far from the optical axis), any aberration arising at the subfield edge closer to the optical axis AX and any aberration arising at the subfield edge farther from the optical axis AX will be substantially the same. Consequently, compensating for the aberration in the mask subfield 53 depends only on the position of the center of the mask subfield 53 in the X-axis direction. As a result, the pattern image is transferred onto the corresponding transfer subfield 56 on the wafer W with a high degree of resolution and little distortion.

Continuing to refer to FIG. 3, while the electron beam EB scans the mask pattern in the X-axis direction, the mask M is continuously moved in the −Y-axis direction. Meanwhile, the wafer W is continuously moved in the +Y-axis direction because an inverted image is formed on the wafer W through the projection lens 15 and the objective lens 19. As the electron beam EB scans the mask M back and forth (in the +X-axis and −X-axis directions), the patterns contained in the scan fields 51A, 51B, etc., are successively transferred onto long, rectangular transfer fields 58A, 58B, etc., along a path 57 in an area 55A of the wafer W. After the area 55A has been exposed, the pattern-transfer process is repeated to transfer a die pattern to an adjacent area 55B.

The patterns formed on the scan fields 51A, 51B, etc., of the mask M are projected onto the corresponding transfer fields 58A, 58B, etc., on the wafer W in a manner such that the patterns of any adjacent two transfer fields overlap slightly by a predetermined amount in the Y-axis direction. In order to correctly stitch the patterns on the wafer W, the first and second electrostatic deflectors 13, 14 are used (FIG. 1). Assume that the width of each of the scan fields 51A, 51B, etc., on the mask M is equal to dY1, (defined by subtracting the width of one of the overlapping areas from the entire width of the scan field), and that the width of each of the boundary regions 52A, 52B, etc., positioned between any two adjacent scan fields 51A, 51B, etc., is dY2 (FIG. 3). The relationship between the scanning speed $V_M$ of the mask M and the scanning speed $V_W$ of the wafer W may then be represented by formula (1) as follows:

$$V_W = \beta[dY1/(dY2+dY2)]V_M \qquad (1)$$

wherein β is the magnification ratio. As the mask M is moved in the direction shown by the arrow $S_M$ in FIG. 3, one of the scan fields 51A, 51B, etc., becomes the current scan field positioned at the optical axis AX. The pattern contained in the current scan field is projected onto the corresponding transfer field on the wafer W (which has been moved in the direction shown by the arrow $S_W$).

FIG. 5 illustrates a circuit pattern formed on a wafer W. In FIG. 5, the dashed line 59 indicates a boundary or a stitching line of two adjacent transfer fields 58A, 58B. The patterns of the two adjacent mask scan fields 51A, 51B (originally formed on the mask M with the boundary region 52A between them, see FIG. 4), are correctly stitched on the wafer W without a gap between the transfer fields 58A, 58B. Although, in the actual process, inverted pattern images are projected onto the wafer, FIG. 5 illustrates the upright pattern images for the purpose of simplifying the explanation.

Continuing to refer to FIG. 5, the pattern features 37W, 32W, 60, and 61 extend over the boundary 59. For example, although the majority of the pattern feature 37W is located in the transfer field 58B, the lower portion of the pattern feature 37W extends into the adjacent transfer field 58A. The upper portion of the pattern feature 32W extends from the transfer field 58A into transfer field 58B. On the other hand, the pattern feature 60 is formed by stitching together two pattern features 33W, 36W. Similarly, the pattern feature 61 is formed by stitching together two pattern features 34W, 35W. The corner portion 60a of the pattern feature 60, and the narrow portion 61a of the pattern feature 61 are located in the vicinity of the boundary 59, requiring a high level of pattern-transfer precision to obtain a high resolution pattern.

FIG. 4 illustrates the scan fields 51A, 51B, together with the boundary region 52B positioned therebetween. The width of the scan fields 51A, 51B in the Y-axis direction is predetermined to be, for example, about 250 μm. The scan field 51A has an overlapping area 31A next to the boundary region 52B, and the scan field 51B has an overlapping area 31B facing the overlapping area 31A. The overlapping areas 31A and 31B have a predetermined width of, for example, 10 μm. The overlapping areas are provided to any two adjacent scan fields, including the scan fields 51C, 51D (shown in FIG. 3).

In FIG. 4, a hatched area 53 indicates the mask subfield illuminated by the incident electron beam. The subfield 53 "moves" in the +X-axis direction in the scan field 51A, and then moves in the −X-axis direction in the adjacent scan field 51B. As a result of this scanning process, the patterns formed in the mask scan fields 51A and 51B are transferred onto the corresponding wafer transfer fields 58A and 58B to slightly overlap on the wafer W. The center line of the overlapping area is the boundary 59.

The features 32, 33, 34, formed in the scan field 51A (FIG. 4), correspond to the features 32W, 33W, 34W as projected onto the respective transfer field 58A (FIG. 5). Also, the features 35, 36, 37, formed in the scan field 51B (FIG. 4), correspond to the features 35W, 36W and 37W as projected onto the respective transfer field 58B (FIG. 5). The upper portions of the mask features 32 and 34 lie in the overlapping area 31A, and the lower portions of the mask features 36 and 37 lie in the overlapping area 31B.

The wafer features 32W and 37W extend from the transfer field 58A to the transfer field 58B across the boundary 59 without a seam. The wafer features 60 and 61, which are composed of features 33W and 36W, and features 34W and 35W, respectively, also extend from the transfer field 58A to the transfer field 58B without significant stitching error. The narrow portion 61a of the feature 61, which requires high precision, has no seam on the boundary 59. Thus, by providing overlapping areas on each scan field, stitching error is substantially reduced from the resultant image at the boundary of adjacent transfer fields on the wafer W.

Referring to FIGS. 4 and 5, when a pattern to be transferred includes a curve to be formed over two transfer fields on the wafer, such as wafer feature 103W, two mask features 101, 102 can be individually formed on the scan fields 51A, 51B. Typically, in such a case, minor stitching error can arise in circled corners 104 and 105 of the transferred feature 103W on the wafer W. However, such errors at the corner edges are often of minor significance, if not negligible.

Figure 6:
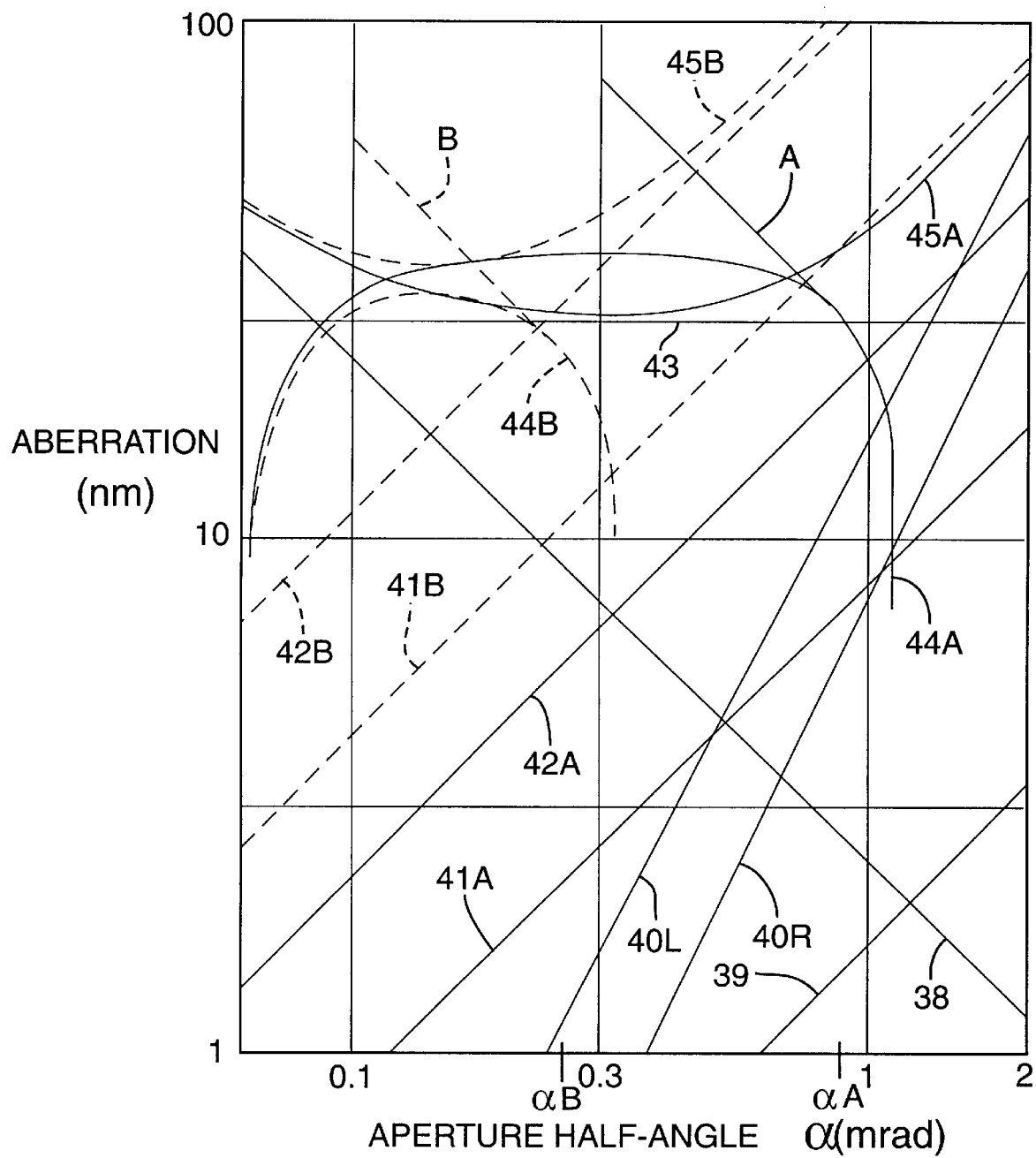
FIG. 6 is a plot of aberration characteristics of a symmetric magnetic doublet projection-optical system used in the pattern-transfer apparatus of FIG. 1.

FIG. 6 is a plot of a simulation of aberration characteristics of an axisymmetric projection-lens system (comprising projection lens 15 and objective lens 19, as shown in FIG. 1). For the simulation, the length of the scan field in the X-axis direction is about 20 mm and the distance from the mask M to the wafer W is about 448 mm. The aberrations of the projection-lens system were measured using two different sizes of illumination subfields 53, a 250 $\mu m \times 250$ $\mu m$ square subfield and a 250 $\mu m \times 50$ $\mu m$ rectangular-shaped subfield.

In FIG. 6, the horizontal axis represents the aperture half-angle $\alpha$ (mrad) of the electron beam EB, and the vertical axis represents magnitude of the aberration (nm). The solid line 38 indicates the blur of the projected image due to diffraction effects. Parallel lines 40L, 40R represent two types of coma, a solid line 39 denotes on-axis chromatic aberration, and a horizontal line 43 denotes a constant level of chromatic aberration of magnification and rotation of the projected image. These aberrations have no relation to the size of the illumination subfield 53.

On the other hand, parallel dashed lines 41B, 42B denote astigmatism and field curvature, respectively, that arises when using a subfield area of about 250 $\mu m$ square, and parallel solid lines 41A, 42A illustrate the resulting astigmatism and field curvature, respectively, when using a rectangular subfield area of about 250 $\mu m \times 50 \mu m$. As is clear from these lines, when a rectangular-shaped subfield (having the shorter sides in the scanning direction) is used, astigmatism and field curvature are about one-fifth of the corresponding astigmatism and field curvature produced with a square-shaped subfield.

The solid curve 45A denotes the total aberration of the projection-lens system when using a 250 $\mu m \times 50$ $\mu m$ rectangular-shaped subfield, while the dashed curve 45B denotes the total aberration when using a 250 $\mu m \times 250$ $\mu m$ square-shaped subfield. The downward solid curve 44A and the downward dashed curve 44B denote the aberrations due to space-charge effects when using a 250 $\mu m \times 50$ $\mu m$ rectangular-shaped subfield and a 250 $\mu m$ square-shaped subfield, respectively. The sum of the aberrations of the projection-lens system and the aberrations due to the space-charge effect for the rectangular-shaped subfield is equal to about 45 nm.

Tangent lines A, B having a slope of about −1 are drawn to the curves 44A, 44B, respectively, making an angle of about 135° to the horizontal line 43. The aperture half-angles at the points in which the tangent lines A, B intersect the horizontal line 43 are $\alpha A$ and $\alpha B$, respectively. It was found that the beam current is proportional to the product of the aperture half angle at the tangent point (i.e., $\alpha A$ for the 250 $\mu m \times 50$ $\mu m$ rectangular-shaped subfield and $\alpha B$ for the 250 $\mu m \times 250$ $\mu m$ square-shaped subfield) and the corresponding aberration value.

Referring to FIG. 6, the beam current for the 250 $\mu m \times 50$ $\mu m$ rectangular-shaped subfield is equal to about 4.1 times the beam current for the 250 $\mu m \times 250$ $\mu m$ square-shaped subfield. This is because the width (along the X-axis direction) of the rectangular-shaped subfield is ⅕ of the width of the square-shaped subfield. If the ratio of the width dX to the length dY is less than ½, the beam current is preferably further increased and the field curvature 42A is reduced. However, too small of a subfield area results in a slower complete pattern transfer to the wafer, decreasing throughout.

If the ratio dX/dY is greater than 115, then the beam current abruptly drops and the field curvature 42A exceeds the chromatic aberrations 43 in the magnification and the rotation at the aperture half-angle $\alpha A$ which lies near 1 mrad. Accordingly, in the first embodiment of the present invention, the width dX of the subfield 53 is preferably ⅕ of the length dY, wherein ⅕ represents the optimum ratio.

Thus, an electron beam having a 250 $\mu m \times 50$ $\mu m$ rectangular cross-sectional area (illumination subfield 53) is preferably used to scan the mask M. The total area of the transmissive portion included in the illumination subfield 53 is calculated in advance as a function of the position of the illumination subfield 53. An appropriate beam current is obtained by multiplying the total area of the transmissive portion of the mask pattern by the electron-beam current density. In addition, the relationship between the changing electron-beam current and the voltage applied to the projection lens electrode 16 and the objective lens electrode 20 is determined in advance of projecting the pattern image onto the wafer W, taking into account any blur of the electron beam due to the space-charge effect. In other words, based on this relationship, the voltage supplied to the electrodes 16, 20 is calculated as a function of a time-dependent beam current to compensate for any defocusing due to the space-charge effect.

In summary, because a symmetric magnetic-doublet projection-lens system is used, resulting aberrations depend only on the radial distance of the electron beam from the optical axis. Further, because the charged-particle beam is shaped so that the width (dX) of its cross-section in the scanning direction is relatively small (and is smaller than its length), the variation in the distance from the optical axis, within the area of the subfield 53, is relatively small. Therefore, the same aberration-correction conditions can be maintained over the entire area of the subfield 53. As a result, the residual aberrations become very small, and the mask pattern can be transferred onto the wafer W with a high degree of precision.

Second Embodiment

The second representative embodiment of the pattern-transfer apparatus of the present invention (illustrated in FIGS. 7–12) also uses an electron beam as the charged-particle beam for successively scanning the scan fields on the masks and transferring the scan fields onto corresponding transfer fields on a wafer W.

The apparatus of the first embodiment is most suitable when the intensity distribution of the electron beam is substantially uniform throughout the electron beam transverse profile. However, if the source of the electron beam is an electron gun used in a temperature-controlled environment, the electron-beam intensity distribution through the transverse profile of the electron beam typically fluctuates. Typically, the intensity distribution of the electron beam is a Gaussian distribution about a symmetric axis. If the scan field of the mask is enlarged for the purpose of increasing wafer throughput, then the lack of intensity uniformity of the electron beam and the resultant lack of uniformity in the integrated exposure energy on the wafer can exceed acceptable ranges.

The second embodiment of the pattern-transfer apparatus of the present invention improves the uniformity of the integrated exposure energy on the wafer W even when the intensity distribution in the transverseprofile of the electron beam fluctuates. In FIGS. 7–13, the same numerical symbols denote the same corresponding elements as those in FIGS. 1–6.

Figure 7:
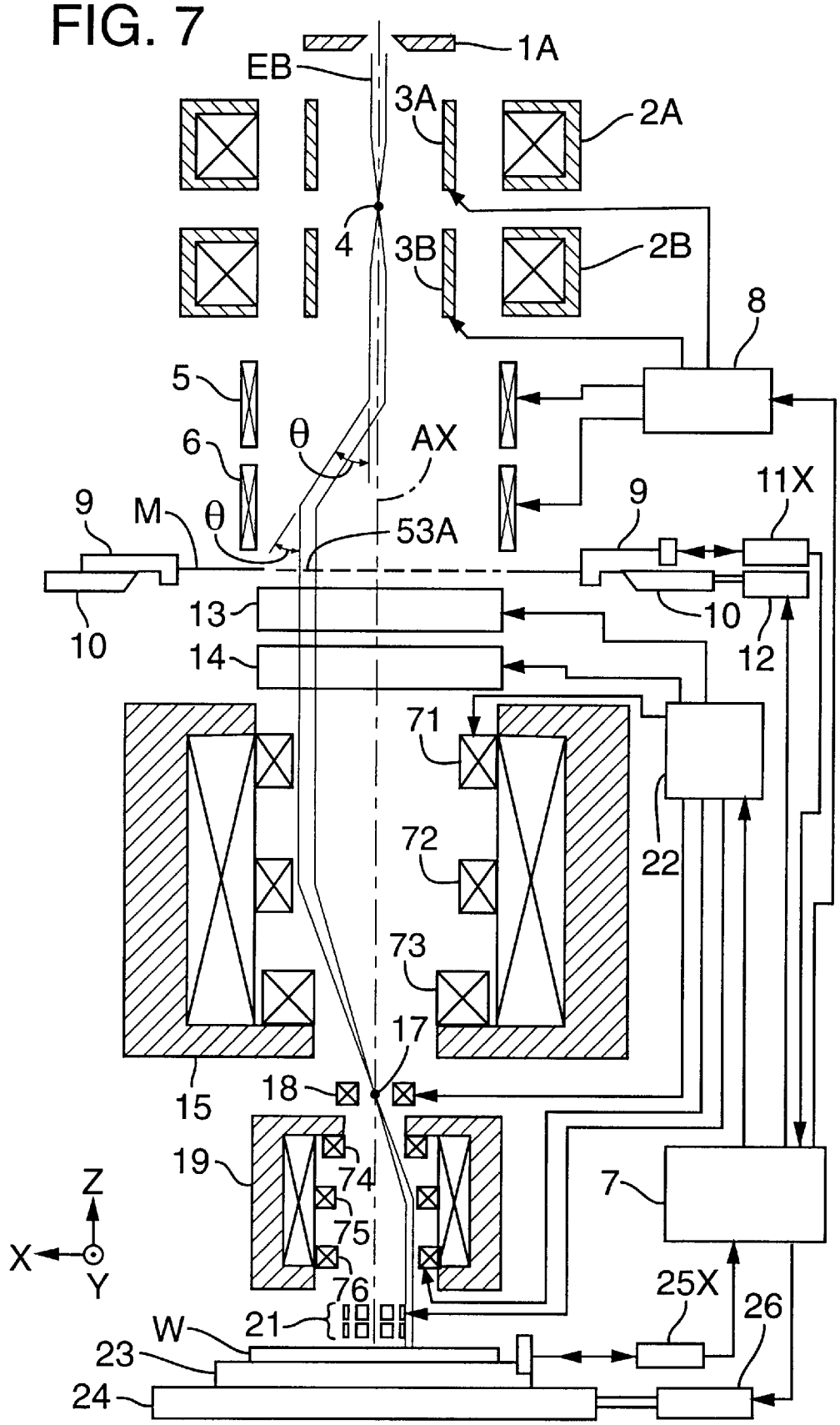
FIG. 7 is a schematic sectional elevational view of the X–Z plane of a second representative embodiment of the pattern-transfer apparatus of the present invention, wherein the charged-particle beam source comprises an electron-beam source.

FIG. 7 illustrates the second representative embodiment of the pattern-transfer apparatus of the present invention. In FIG. 7, the Z axis is parallel to the optical axis AX of the electronic optical system, the X-axis extends horizontally in the plane of the paper, and the Y-axis extends perpendicular to the plane of the paper. An electron beam EB emitted by an electron gun (not shown but understood to be upstream of the components shown in the figure) is guided to a beam shaper 1A defining a square-shaped aperture, by which the electron beam is shaped to have a square transverse profile. A first condenser lens 2A, positioned downstream of the beam shaper 1A, converges the shaped electron beam EB at a first crossover 4. A second condenser lens 2B, positioned downstream of the first condenser lens 2A, collimates the electron beam EB.

The collimated electron beam EB is then deflected an angle θ in the X-axis direction by a first electromagnetic deflector 5 positioned downstream of the second condenser lens 2B. The deflected electron beam EB is then deflected an angle −θ in the −X-axis direction by a second electromagnetic deflector 6. As a result, the collimated electron beam EB strikes a scan field on the mask M at about a right angle to the plane of the mask. The scan fields on the mask extend along the mask in the X-axis direction. The mask M is positioned to be conjugate with the beam shaper 1A.

The deflection angles θ, −θ of the electromagnetic deflectors 5, 6, respectively, are controlled by a master controller 7. As in the first embodiment, the master controller 7 controls the overall operations of the pattern-transfer apparatus. Specifically, the master controller 7 controls the first deflection controller 8 to supply an appropriate level of electrical current to the deflectors 5, 6. The electrical current supplied to the first and second electromagnetic deflectors 5, 6 is regulated so that the rate of change of the current is proportional to θ/sin θ, whereby the incident angle of the electron beam EB to the mask M is kept at 90 degrees.

The electron beam EB is scanned in the X-axis direction at a constant speed throughout the scan field of the mask M while keeping the incident angle of the electron beam on the mask at an angle of about 90 degrees. Accordingly, as discussed above in relation to the first embodiment, the distribution of the exposure energy of the electron beam is uniform on both the mask M and the wafer W.

Also, as with the first embodiment, a variable voltage is applied to the first and second electrodes 3A, 3B by the first deflection controller 8 according to the current density of the electron beam. As with the first embodiment, the current density is increased in mask pattern areas having a low feature density and is decreased in areas of the mask having a high feature density.

First and second electrostatic deflectors 13, 14, preferably each comprising flat conductive plates extending in the X-axis direction (FIG. 7), are positioned between the mask M and the projection lens 15. The first electrostatic deflector 13 deflects the electron beam EB by an angle θ in the Y-axis direction, and the second electrostatic deflector 14 deflects the electron beam EB by an angle −θ in the Y-axis direction. The deflection angles θ, −θ of the electrostatic deflectors 13, 14 are controlled by the master controller 7 via the second deflection controller 22.

The electron beam EB passing through the mask M is converged by a projection lens 15 at a second crossover 17 on the optical axis AX. At the second crossover 17, the pattern image is inverted. The electron beam EB then passes through an objective lens 19 having a magnification β of less than unity (e.g., ¼). The image of the subfield 53A is formed at a reduced magnification on a corresponding transfer subfield on the wafer W. As with the first embodiment, the projection lens 15 and the objective lens 19 are axisymmetric magnetic doublet lenses.

Asymmetric electromagnetic deflectors 71, 72, 73 are situated inside the projection lens 15. Similarly, asymmetric electromagnetic deflectors 74, 75, 76 are situated inside the objective lens 19. The electromagnetic deflectors 71–76 are controlled by a second deflection controller 22 that is, in turn, controlled by the master controller 7. An octopole electromagnetic deflector 18 surrounds the second crossover 17 to correct astigmatism. The amount of astigmatism correction is controlled by the second deflection controller 22.

In this embodiment, aberrations in the projection-lens system, comprising the projection lens 15 and the objective lens 19, are controlled in a dynamic fashion by simultaneously changing the current level applied to the electromagnetic deflectors 71–73 and the current level applied to the electromagnetic deflectors 74–76 based on the X-axis position of the electron beam EB on the mask M. At the same time, the current level supplied to the projection-lens system 15, 19 is varied in order to dynamically control the focal point of the electron beam. The electric current supplied to the electromagnetic deflector 18 is also dynamically adjusted to compensate for the astigmatism.

Two pairs of octopole electrostatic deflectors 21 are positioned between the objective lens 19 and the wafer W. The deflection angles imported to the electron beam EB by the electrostatic deflectors 21 are controlled by the second deflection controller 22. The electrostatic deflectors 21 deflect, in the X-axis and Y-axis directions, the electron beam EB and scan the electron beam on the wafer W. The electrostatic deflectors 21 are also used to compensate for any relative vibration between the mask M and the wafer W, and for distortion in the projection-lens system 15, 19.

The mask stage 9 for holding the mask M, and the sample stage 23 for holding the wafer W operate in the same manner as those described in the first representative embodiment.

Information useful for performing an accurate projection of the mask pattern, i.e., the composition of features defined by the mask M and the layout of the transfer fields of the wafer W, is supplied to the master controller 7. Based on this information, the master controller 7 controls the scanning speed of the electron beam EB and the focal point of the pattern image via the first and second deflection controllers 8, 22. At the same time, the master controller 7 controls the positions and the driving speeds of the mask stage 9 and the sample stage 23 so that a reduced image of the mask pattern is formed through the projection-lens system 15, 19 on corresponding transfer fields on the wafer W.

Figure 9:
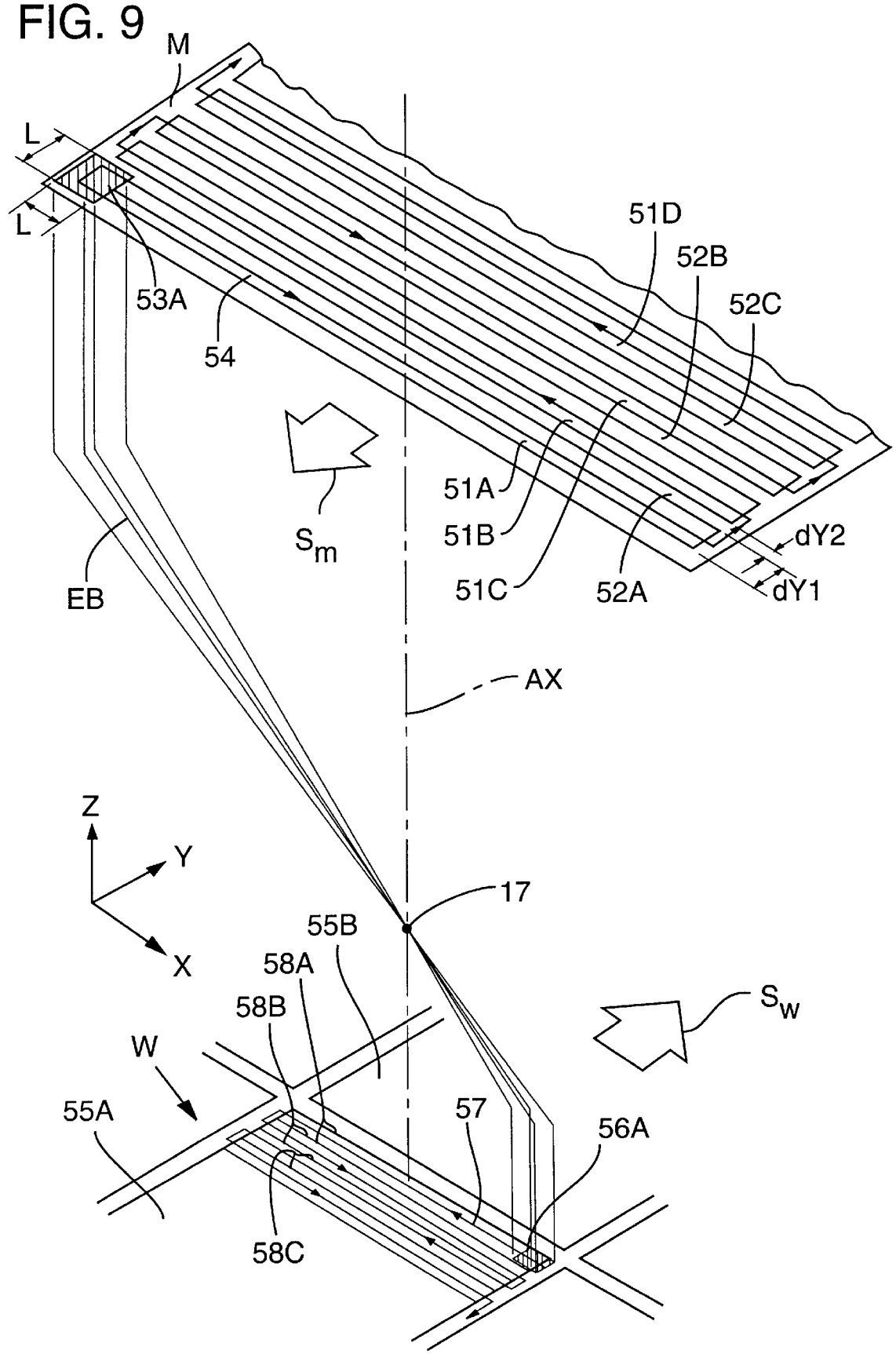
FIG. 9 is a perspective view showing transfer of a mask pattern onto a wafer utilizing the pattern-transfer apparatus of FIG. 7.

FIG. 9 illustrates how a mask pattern is transferred onto the wafer W, at a magnification of less than unity, according to the second embodiment. The circuit pattern formed on the mask M is divided into a plurality of long rectangular scan fields 51A, 51B, etc., all of which extending in the X-axis direction. Boundary regions 52A, 52B, etc., are formed between adjacent scan fields. Each of the scan fields contains a portion of the circuit pattern which is to be transferred onto the wafer W. The boundary regions are non-pattern areas that block or scatter the electron beam.

In FIG. 9, the electron beam EB, which has been deflected by the electromagnetic deflectors 5, 6, strikes the scan field 51A. The incident electron beam EB illuminates a square illumination subfield 53A in the scan field 51A. Electrons passing through transmissive regions of the scan field 51A strike the corresponding transfer subfield 55A on the wafer W at a right angle, and forms a square-shaped exposure subfield 56A which is similarly shaped by smaller than the illumination subfield 53A. In this arrangement, the electron beam EB is scanned back and forth in the X-axis and −X-axis directions successively along the scan fields 51A, 51B, etc. The length of each scan field in the X-axis direction is greater than or equal to the width of one die of the semiconductor chip being manufactured, so that the stitching portion of adjacent areas is inconspicuous.

In general, when the length of each scan field on the mask M is elongated in the scanning direction, aberrations increase as the beam is increasingly deflected away from the optical axis AX. To overcome this problem and to reduce off-axis aberrations, in the second embodiment, multiple electromagnetic deflectors 71–76 are provided in the axisymmetric magnetic doublet type optical system (comprising the projection lens 15 and the objective lens 19), as shown in FIG. 7. In addition, the width dX in the X-axis direction and the length dY in the Y-axis direction of the illumination subfield 53A are substantially equal, as shown in FIG. 9, thereby providing maximal illumination area. In this arrangement, fluctuation of the electron beam due to collisions between the electrons is minimized, and the pattern image can be formed at a high resolution.

Similar to the first embodiment, the mask M is continuously moved in the Y-axis direction (arrow $S_M$ in FIG. 9), while the electron beam EB is scanned in the X-axis direction. At the same time, the wafer W is continuously moved in the Y-axis direction (arrow $S_W$ in FIG. 9) because an inverted image is formed on the wafer W through the projection lens 15 and the objective lens 19. As the electron beam EB scans the mask M back and forth (in the X-axis direction), the pattern features defined in the scan fields 51A, 51B, etc., are successively transferred onto the corresponding transfer fields 58A, 58B, etc., along the path 57 in area 55A of the wafer W. Pattern transfer to the adjacent area 55B is performed in a similar manner.

The pattern features formed in the scan fields 51A, 51B, etc., of the mask M are projected onto the corresponding transfer fields 58A, 58B, etc., on the wafer W in such a way that any two adjacent transfer fields overlap slightly by a predetermined amount in the Y-axis direction. Similar to the first embodiment, the electrostatic deflectors 13, 14, shown in FIG. 7 are used to correctly stitch together any two adjacent scan fields on the wafer W at the overlapping areas. The relation between the scanning speed $V_M$ of the mask M and the scanning speed $V_W$ of the wafer W is expressed by formula (1) above, using the width dY1 of the scan field (which is defined by subtracting the width of one of the overlapping portions from the entire width of the scan field), the width dY2 of the boundary region, and the magnification β.

As the mask M advances in the direction shown by the arrow $S_M$ in FIG. 9, one of the scan fields 51A, 51B, etc., becomes the scan field positioned across the optical axis AX. The pattern contained in this scan field is projected onto the corresponding transfer field on the wafer W, while the focal point of the pattern image is continually adjusted and any distortion and other aberrations in the projected image are compensated for.

Figure 10:
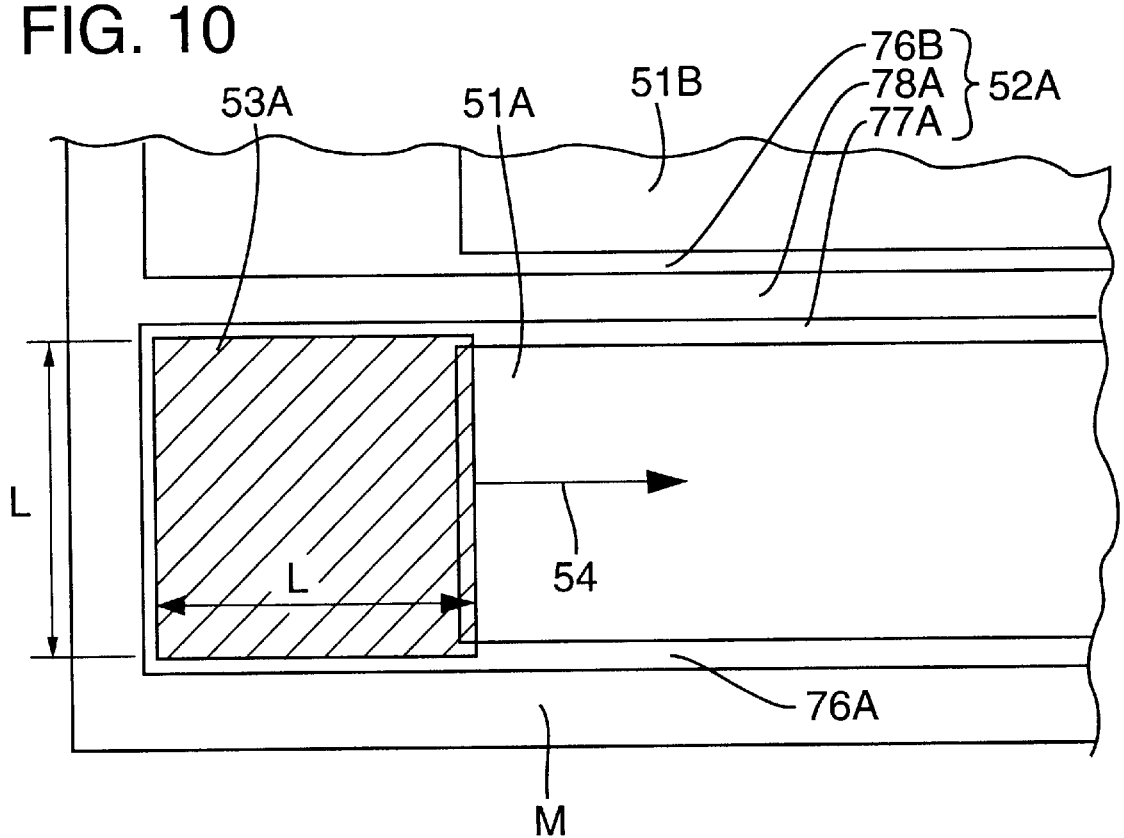
FIG. 10 is an enlarged plan view of a subfield 53A on the mask shown in FIG. 9.

FIG. 10 is a partial, enlarged view of a scan field 51A on the mask M and of the illumination subfield 53A, according to the second embodiment. The scan field 51A has non-pattern areas 76A, 77A extending in the Y-axis direction along the upper and lower edges of the scan field. Similarly, an adjacent scan field 51B has non-pattern areas 76B, 77B extending along its edges. A relatively wide non-pattern band 78A extends between the non-pattern area 77A of the scan field 51A and the non-pattern area 76B of the scan field 51B. The boundary region 52A (shown in FIG. 9) includes the wide band 78A and the non-pattern areas 77A, 76B. The square-shaped illumination subfield 53A, having a side L, is scanned along the scan field 51A in the direction shown by the arrow 54 (FIG. 10).

In the second embodiment, an electron gun is used in a temperature-controlled environment, and the electron-beam intensity (I) fluctuates due to non-uniformity of the electron-gun cathode temperature. Typically, unevenness of the cathode work function also contributes to fluctuation of the electron-beam intensity (I).

Figure 11:
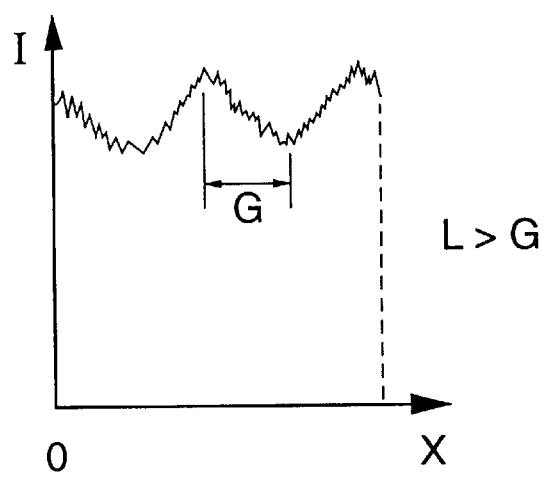
FIG. 11 is a graph illustrating a representative intensity distribution of an electron beam.

FIG. 11 is a graph illustrating an intensity distribution of an electron beam as a function of position across the aperture of the beam shaper 1A. In the graph, the X-axis value represents the position on the mask M along the X-axis, as obtained from the X-axis position across the aperture of the beam shaper 1A and the projection magnification. The intensity of the electron beam varies in the X-axis direction in a waveform distribution, while it vibrates minutely along the curve. The distance G between a point that yields the maximum electron-beam intensity and a point that yields the minimum electron-beam intensity is called a "ripple," which is denoted by symbol G in FIG. 11. Although the electron-beam intensity distribution changes with time, the ripple G typically does not change.

In the second embodiment, the width L of the illumination subfield 53A formed on the mask M, is fixed to be a value greater than the ripple G (FIG. 10). In other words, the width of the aperture of the beam shaper 1A is greater than the value of the ripple G so that the transverse area of the electron beam on the mask also has a width greater than the ripple G. Preferably, the ripple G value is determined based on an average value calculated from multiple measurements of the electron-beam intensity. For example, the width L is preferably equal to about double or quadruple the value of the ripple G to satisfactorily integrate the exposure energy delivered to the wafer W and thus provide a substantially uniform exposure along the X-axis direction. That is, even if the intensity of the electron beam entering the beam shaper 1A fluctuates, the integrated exposure energy stays within an acceptable level as the electron beam scans on the mask M because the aperture width of the beam shaper 1A and, therefore, the width L of the illumination subfield 53A are set to be greater than the ripple G.

The mask M shown in FIG. 10 has a relatively wide margin (i.e., a non-pattern area) along the edges extending in the direction perpendicular to the scanning direction, so that the electron beam scans the mask M with the same cross sectional area (i.e., the illumination subfield 53A) even at the very beginning of the scan of each scan field. If the margin between the mask edge and the short side of the scan field is insufficient, excessive exposure energy is accumulated in the end portion of each scan field, which may cause the mask temperature to rise. To overcome this problem, in the second embodiment, a second beam shaper can be provided directly downstream of beam shaper 1A for the purpose of adjusting the width of the cross-sectional area of the electron beam according to the X-axis position of the scan field. In particular, when starting to scan each scan field, the width L of the subfield in the scan field in the X direction, is slightly reduced. As the scan progresses along the X-axis, the width L of the subfield is gradually increased to a predetermined value. The width L of the subfield is maintained at the predetermined increased value until the beam approaches the opposite end of the scan field. When the beam approaches the opposite end, the width L of the subfield is, again, gradually decreased.

Figure 8:
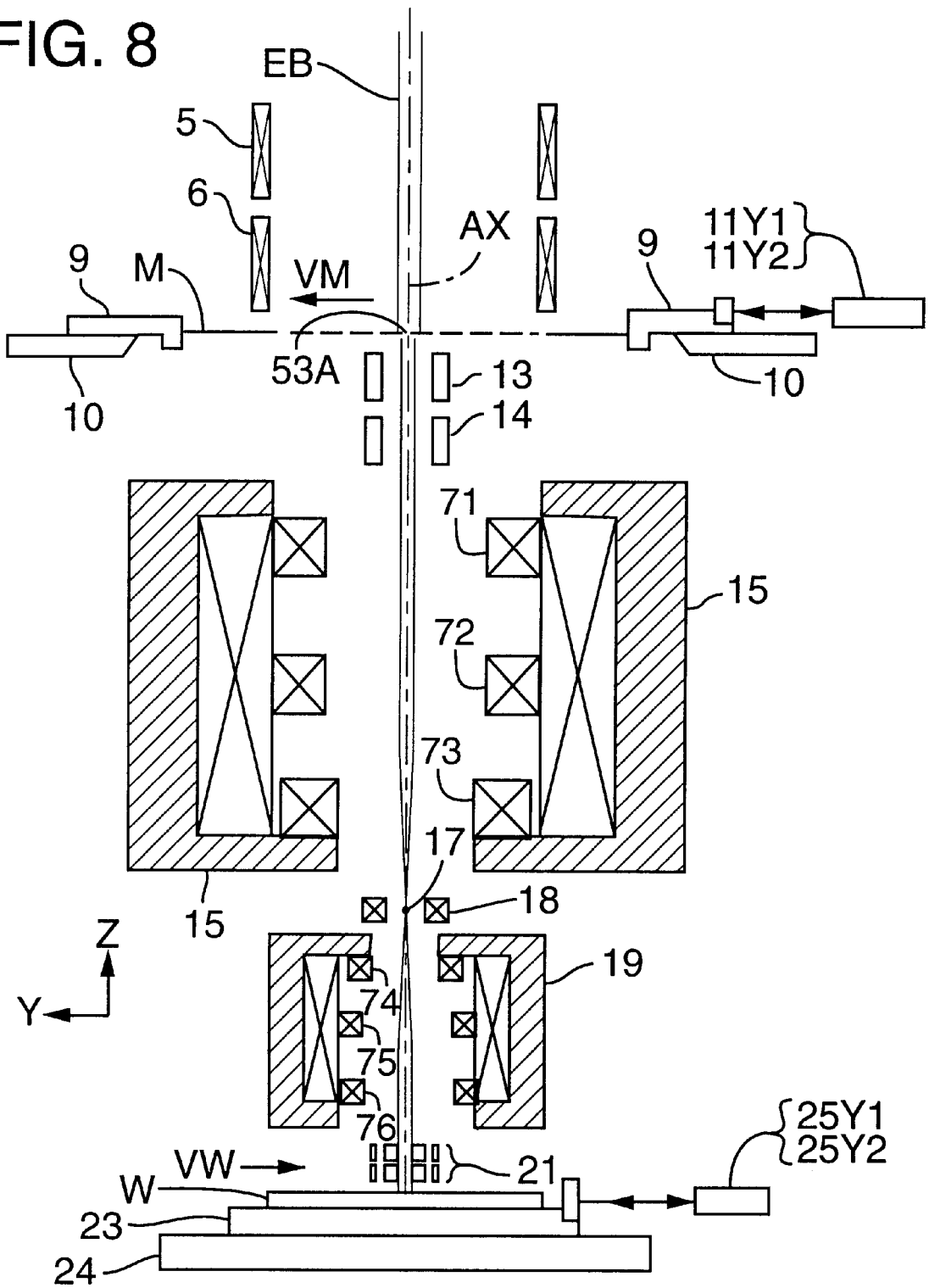
FIG. 8 is a schematic sectional elevational view of the Y–Z plane of a portion of the pattern-transfer apparatus of FIG. 7.
Figure 12:
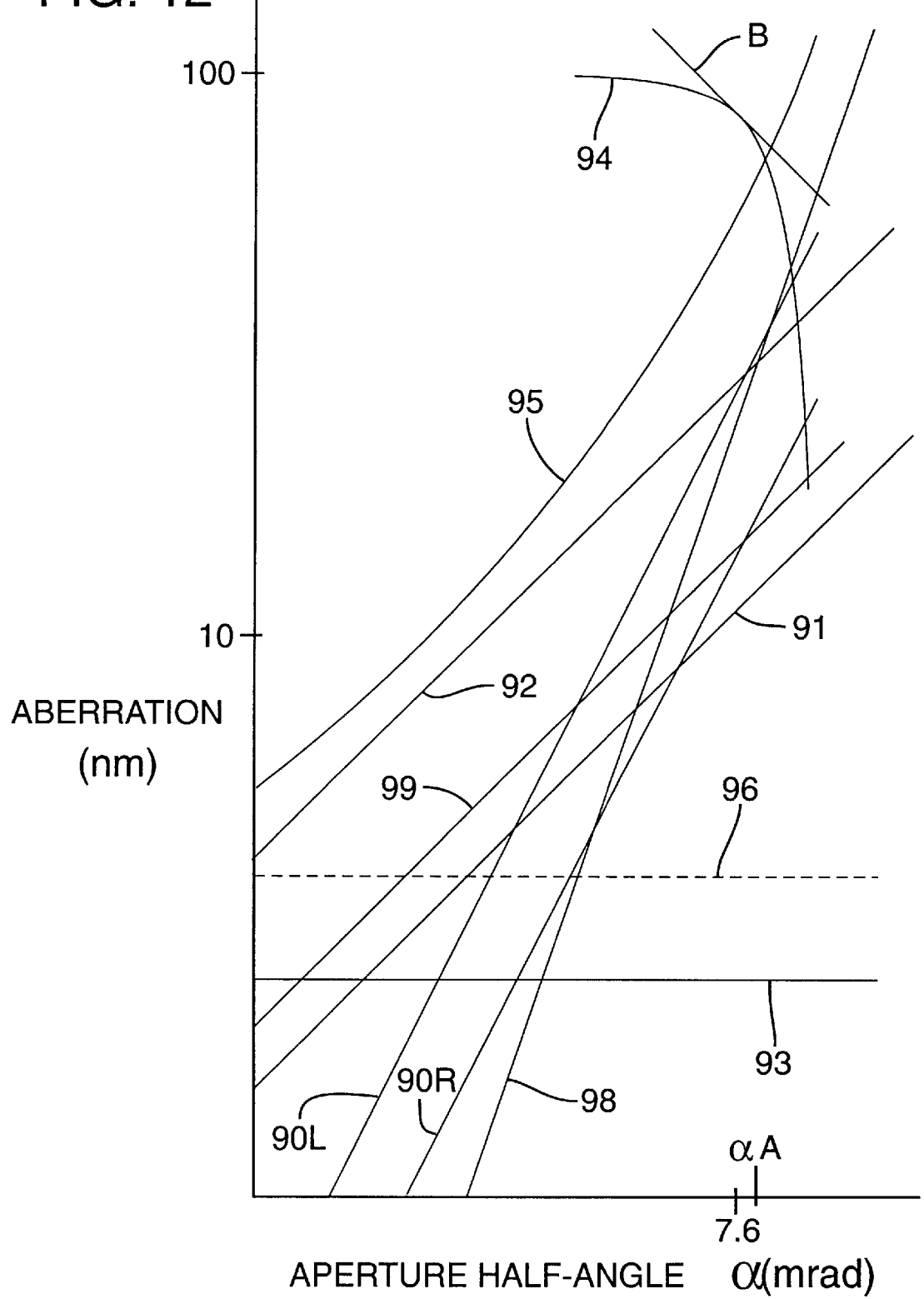
FIG. 12 is a plot of aberration characteristics of the pattern-transfer apparatus of FIG. 7, including axisymmetric magnetic doublet projection-optical system combined with an electromagnetic deflector and an astigmatism-correction coil.

FIG. 12 illustrates a simulation of resulting aberration characteristics in a symmetric magnetic doublet projection-lens system, such as the projection lens 15 and the objective lens 19 system of the second embodiment, used in combination with a plurality of electromagnetic deflectors 71–76 (as shown in FIGS. 7 and 8). For the simulation, the length of the scan field in the X-axis direction is about 10 mm, the distance between the mask M and the wafer W is about 560 mm, and a 250 $\mu$m×250 $\mu$m illumination subfield 53A is used.

In FIG. 12, the horizontal axis represents the aperture half-angle $\alpha$ (mrad) of the electron beam, and the vertical axis represents the magnitude of the aberration (nm). The solid line 98 indicates the blur of the projected image due to spherical aberration. Two parallel lines 90L, 90R represent two types of coma, a solid line 99 denotes on-axis chromatic aberration, and a horizontal line 93 denotes a constant level of chromatic aberration of magnification and rotation of the projected image.

The parallel solid lines 91, 92 denote astigmatism and field curvature, respectively. The parabola 95 denotes the total of these aberrations, and the curve 94 denotes aberration due to the space-charge effect. The total aberration of the projection-lens system 15, 19 plus the aberration due to the space-charge effect is have a sum of about 100 nm in this example. A tangent line B having a slope of −1 is drawn to the curve 94 at an angle of about 135° to the horizontal line 93, and the aperture half-angles at this tangent points is labeled $\alpha$A. The electron-beam current is proportional to the product of the aperture half angle $\alpha$A at the tangent point and the corresponding aberration value.

The horizontal dashed line 96 denotes distortion, which has a constant value of about 3.7 nm. This means that the pattern image can be formed accurately with minor distortion. Furthermore, the aperture half-angle $\alpha$A is about 7.7 mrad in this example, which is relatively large, reducing the blur of the projected image.

Third Embodiment

The third representative embodiment of the pattern-transfer apparatus of the present invention (illustrated in part in FIGS. 13–17) has the same structure as that shown in FIGS. 7 and 8. However, in the third embodiment, an electron beam having a Gaussian-type transverse intensity distribution is used.

FIG. 13 illustrates the intensity distribution of the electron beam within an L×L illumination subfield 53B. The intensity distribution has a peak intensity at the center of the illumination subfield 53B. If the peak intensity is assumed to be unity (I=1), the intensity at the periphery is less, typically about 0.9 (I=0.9). If a pattern transfer is performed using a conventional step-and-repeat scheme, the maximum integrated exposure energy on the wafer would be unity, but the minimum exposure energy would be equal to 0.9. Thus, the integrated exposure energy would have an error of about ±10% in both the X-axis and Y-axis directions.

However, when using the third embodiment of the pattern transfer apparatus of the present invention, a pattern transfer is performed by scanning a charged-particle beam having an L×L cross-sectional area, as shown in FIG. 14(a). Thus, the exposure energy in the scanning direction (i.e., the X-axis direction) becomes substantially uniform. Although a minor variation in the Y-axis direction remains, as shown in FIG. 14(b), the difference between the peak intensity at the center of the subfield (0.97) and the minimum at the periphery of the subfield (0.94) is substantially decreased as a result of the scan. Thus, the error or non-uniformity of the integrated exposure energy in the Y-axis direction is reduced to ±3% (i.e., (0.03/0.97)·100), which is about one third of the error obtained following a conventional step-and-repeat method.

In order to further reduce non-uniformity of the integrated exposure energy in the Y-axis direction (which is depicted as the curved portion in FIG. 14(b)), the electron beam may be shaped to form an illumination subfield 53C as shown in FIG. 16(a). Such an illumination subfield 53C has a concave-shaped trailing edge so that the subfield narrows in the middle. FIG. 15 illustrates the intensity distribution of the electron beam when such a subfield shape is used. An arched area 79 is removed from the bottom of the L×L square-shaped subfield. Assuming the peak electron-beam intensity at the center of the subfield is unity, the minimum electron-beam intensity at the farthest corner of the subfield is less, typically about 0.9. When the mask M is scanned in the X-axis direction using an electron beam that forms illumination subfield 53C on the mask surface, the integrated exposure energy D in the Y-axis direction is leveled as the electron beam scans the mask M. The resultant exposure energy D is equal to about 0.94, as shown in FIG. 16(b). The value 0.94 is calculated based on the exposure energy obtained in the L×L illumination subfield 53B shown in FIG. 14(a). Accordingly, the uniformity of the electron beam incident upon the mask M is improved with a "concave-shaped" subfield 53C.

Figure 17A:
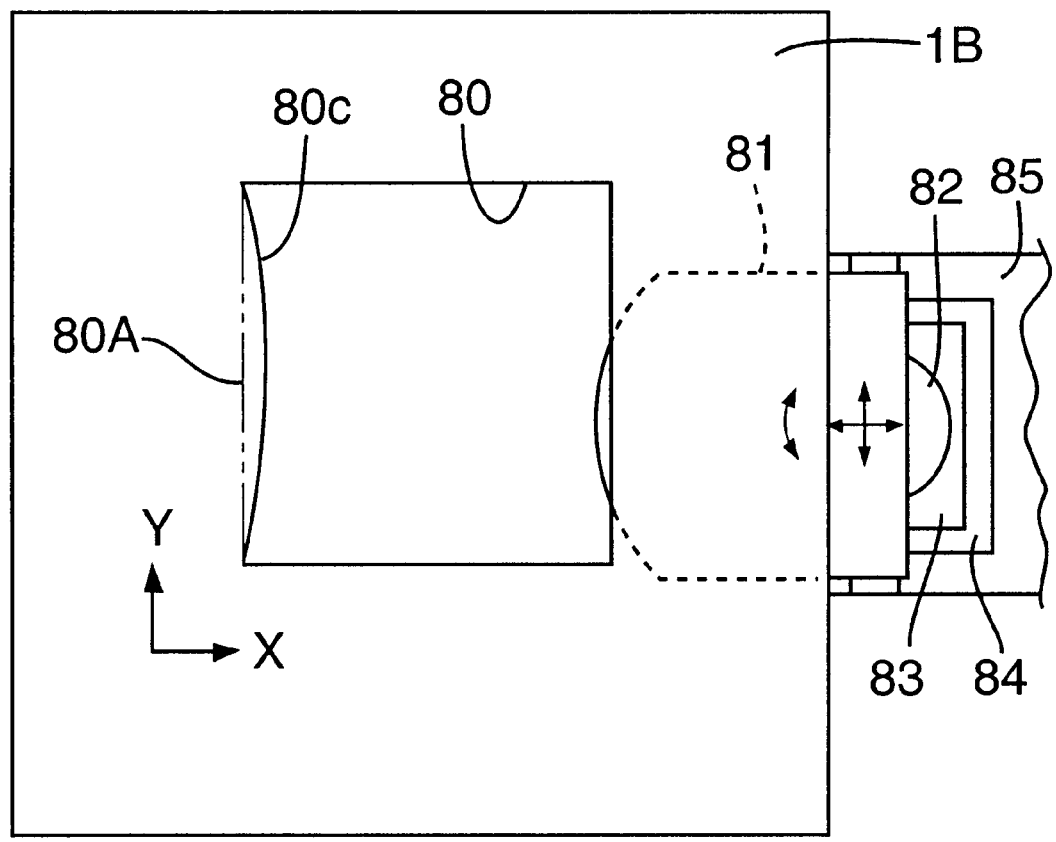
FIG. 17 (a) is a plan view of a beam shaper having an aperture for creating a subfield as shown in FIG. 15.
FIG. 17(b) is a partial, cut-away side view of the beam shaper shown in FIG. 17(a).
Figure 17B:
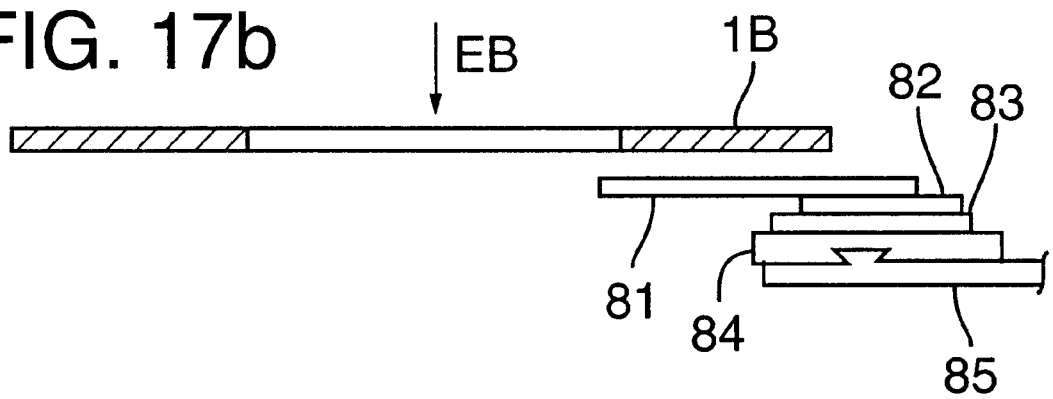

FIGS. 17(a) and 17(b) illustrate how an electron beam having a concave cross-section can be generated. FIG. 17(a) is a plan view of a beam shaper 1C defining an aperture 80, and FIG. 17(b) is a side elevational view of the same. The aperture 80 has three straight sides and a concave side 80C. A square-shaped aperture 80A, similar to that used in the second embodiment of the present invention, is depicted by the broken line in FIG. 17(a) for comparison with the concave aperture 80 of the third embodiment. A shield plate 81 having a convex-shaped edge is positioned directly below the beam shaper 1C. The shield plate 81 is mounted on a base 85. The base 85 includes a rotational stage 82, an X-axis stage 83 that moves the shield plate 81 in the X-axis direction, and a Y-axis stage 84 that moves the shield plate 81 in the Y-axis direction, so that the position of the shield plate 81 is finely adjustable in the X-axis, Y-axis, and rotational directions under the beam shaper 1B.

Whenever the shield plate 81 is fully retracted from the aperture 80, a concave illumination subfield 53C is formed on the mask M as an electron beam passes through the aperture 80. If a margin area of the mask M is insufficient, or if the intensity distribution of the electron beam varies over time, the shield plate 81 can be extended partially over the aperture 80 to shield a portion of the electron beam, as shown in FIG. 17(a), so as to make the integrated exposure energy uniform on the mask and, hence, on the wafer.

Although three shapes of illumination subfields 53A, 53B, 53C have been described as examples herein, the invention is not limited to these examples. These particular beam shapes are advantageous because, (1) a rectangular-shaped subfield 53A facilitates aberration correction, (2) a square-shaped subfield 53B (when sized to have a dimension greater than the value of the ripple G) reduces the aberration efficiently, and allows high-throughput, and (3) a concave subfield 53C provides uniform exposure of the electron beam energy on the mask.

If a beam having such a concave cross-section is used, an astigmatism correction coil (or a deflector) can be provided for correcting for any astigmatism arising in the charged-particle beam that has passed through the mask. The astigmatism-correction coil or the deflector is preferably situated asymmetrically with respect to the optical axis of the projection-lens system. In this arrangement, if the intensity distribution of the charged-particle beam fluctuates in the scanning direction with a ripple, it is preferable for the charged-particle beam to have a cross-section having a width in the scanning direction that is greater than the width of the ripple. If the intensity distribution of the charged-particle beam has a profile such that the intensity is greater in the center and lower in the periphery, it is preferable for the charged-particle beam to have a cross-section whose trailing edge is an arc (rather than straight) so that the cross-sectional area narrows in the middle in the scanning direction.

On the contrary, if the charged-particle beam has an intensity distribution having a lower intensity at the center of its cross-sectional area and a higher intensity in the periphery, the charged-particle beam can be shaped so that the trailing side of the cross-sectional illumination area swells in the middle. Also, in this case, an asymmetric astigmatism-correction coil (or a deflector) is provided for the purpose of correcting for the astigmatism arising in the charged-particle beam that has passed through the mask.

If the intensity distribution of the charged-particle beam fluctuates in the scanning direction with a ripple G, as shown in FIG. 11, the charged-particle beam is preferably shaped so that the width L of its cross-sectional illumination area in the scanning direction is greater than the width of the ripple G, for example, n times as wide as the ripple G, where n is an even integer. If the intensity distribution of the charged-particle beam is a Gaussian distribution, the cross-sectional area of the charged-particle beam is preferably made concave, as has been described above.

In the various representative embodiments of the pattern-transfer apparatus of the present invention, the combination of an axisymmetric projection-lens system, a focal-point control via axisymmetric electrodes in the lenses of the projection-lens system (i.e., electrodes 16, 20), and regulation of the voltage applied to said electrodes, provides for correction of focal-point variation at a relatively high response speed as the beam scans on the mask.

Further, the pattern-transfer apparatus of the present invention also provides for adjustment of the focal point of the projection-lens system in response to changes in the current density of the charged-particle beam that passes through the mask pattern. Even if the focal point of the projected image shifts due to differences in pattern density and space-charge effects, the focal point is optimally corrected.

In the pattern-transfer apparatus and methods of the present invention, the charged-particle beam is shaped so as to have a cross-sectional area that cancels or reduces variation in the intensity distribution of the charged-particle beam. This results in a substantially uniform integrated exposure energy on the mask. An astigmatism-correction coil (i.e., a deflector) is provided to correct astigmatism arising in the charged-particle beam that passes through the mask and to reduce off-axis aberration of the projection-lens system. The remaining aberrations change depending only on the distance from the optical axis.

Having illustrated and described the principles of the invention with reference to preferred embodiments, it should be apparent to those skilled in the art that the invention can be modified in arrangement and detail without departing from such principles. We claim all the modifications coming within the spirit and scope of the following claims.

What is claimed is:

1. A charged-particle beam projection-microlithography apparatus for transferring a mask pattern image to a substrate using a scanning charged-particle beam, the apparatus comprising along an optical axis in the trajectory direction of the charged-particle beam:

(a) a beam shaper situated downstream of a charged-particle beam source so as to receive a charged-particle beam from a charged-particle beam source and shape the charged-particle beam to have a rectangular transverse profile;

(b) a scanner positioned between the beam shaper and a mask, for deflecting the charged-particle beam so that the beam scans the mask in a predetermined scanning direction and for directing the charged-particle beam onto the mask pattern such that a longer side of the rectangular transverse profile of the charged-particle beam extends in a direction substantially perpendicular to the predetermined scanning direction; and (c) an axisymmetric projection-lens system positioned downstream of the mask for converging the charged-particle beam that passes through the mask pattern to form an image of the mask pattern on the substrate.

2. The apparatus of claim 1, further comprising a first condenser lens positioned between the beam shaper and the scanner for converging the charged-particle beam at a first crossover, and a second condenser lens positioned between the first condenser lens and the scanner for collimating the charged-particle beam.

3. The apparatus of claim 2, wherein each of the first and second condenser lenses comprises an electromagnetic lense.

4. The apparatus of claim 1, wherein the scanner comprises:

a first deflector positioned downstream of the second condenser lens for deflecting the charged-particle beam in an X-axis direction by a deflection angle $\theta$ relative to the optical axis, wherein the X-axis is substantially perpendicular to the optical axis; and a second deflector positioned downstream of the first deflector for deflecting the charged-particle beam, deflected by the first deflector, by a deflection angle $-\theta$ relative to the optical axis, in a $-X$-axis direction.

5. The apparatus of claim 4, wherein the first and second deflectors comprise electromagnetic deflectors each adapted to receive an electric potential that causes the respective first and second deflectors to change the deflection angles at which the charged-particle beam is deflected.

6. The apparatus of claim 5, wherein the electric potential applied to the first and second deflectors is regulated so that a rate of change of the applied electric potential is proportional to $\theta/\sin\theta$.

7. The apparatus of claim 1, wherein the axisymmetric projection-lens system comprises:

a projection lens for converging the charged-particle beam that passes through the mask pattern to cause the charged-particle beam to form a pattern image at a second crossover; and an objective lens positioned downstream of the projection lens for reducing the pattern image formed by the charged-particle beam by a magnification of less than unity.

8. The apparatus of claim 7, wherein each of the projection lens and the objective lens comprises a respective conductive electrode situated symmetrically about the optical axis, the conductive electrodes being adapted to receive respective electric potentials for controlling a focal point of the projection-lens system.

9. The apparatus of claim 8, further comprising a charged-particle beam source, and a controller connected to the charged-particle beam source for changing the current density of the charged-particle beam in response to a change in feature density of the mask.

10. The apparatus of claim 9, wherein the controller increases the charged-particle beam current density in mask areas of low feature density and increases the charged-particle beam current density in mask areas of high feature density.

11. The apparatus of claim 8, wherein the conductive electrodes in the projection lens and in the objective lens are operable to adjust the focal point of the projection-lens system in response to changes in the charged-particle beam current density based on the feature density of the mask.

12. The apparatus of claim 7, further comprising a first octopole electromagnetic deflector positioned around the second crossover for deflecting the charged-particle beam pattern image to compensate for astigmatism.

13. The apparatus of claim 7, further comprising an electrostatic deflector positioned downstream of the objective lens, for deflecting the charged-particle beam to compensate for relative vibration between the mask and the substrate.

14. The apparatus of claim 1, wherein the beam shaper shapes the charged-particle beam to have a rectangular transverse profile having a length and width, the width in the predetermined scanning direction being less than or equal to one-fifth of the length.

15. A charged-particle beam projection-microlithography apparatus for transferring a mask pattern image to a substrate using a scanning charged-particle beam, the apparatus comprising along an optical axis in the trajectory direction of the charged-particle beam:

(a) a source of a charged-particle beam having a non-uniform intensity distribution in a direction perpendicular to the optical axis and a charged-particle-beam scanning direction, the intensity distribution having a minimum charged-particle-beam intensity and a maximum charged-particle-beam intensity;

(b) a beam shaper situated so as to receive the charged-particle beam and shape the charged-particle beam to have a transverse profile width in the scanning direction that is greater than a distance in the intensity distribution from the maximum charged-particle-beam intensity to the minimum charged-particle-beam intensity;

(c) a scanner positioned between the beam shaper and a mask for deflecting the charged-particle beam so that the beam scans a scan field of a mask pattern in the scanning direction; and (d) an axisymmetric projection-lens system positioned downstream of the mask for converging the charged-particle beam that passes through the mask pattern to form an image of the mask pattern on the substrate.

16. The apparatus of claim 15, further comprising a first condenser lens positioned between the beam shaper and the scanner for converging the charged-particle beam at a first crossover, and a second condenser lens positioned between the first condenser lens and the scanner for collimating the charged-particle beam.

17. The apparatus of claim 16, wherein each of the first and second condenser lenses comprises an electromagnetic lens.

18. The apparatus of claim 15, wherein the scanner comprises:

a first deflector positioned downstream of the second condenser lens for deflecting the charged-particle beam in an X-axis direction by a deflection angle θ relative to the optical axis, wherein the X-axis is substantially perpendicular to the optical axis; and a second deflector positioned downstream of the first deflector for deflecting the charged-particle beam, deflected by the first deflector, by a deflection angle −θ relative to the optical axis, in a −X-axis direction.

19. The apparatus of claim 18, wherein each of the first and second deflectors comprises an electromagnetic deflector adapted to receive an electric potential that causes the respective first and second deflectors to change the deflection angles at which the charged-particle beam is deflected.

20. The apparatus of claim 19, wherein the electric potential applied to the first and second deflectors is regulated so that a rate of change of the applied electric potential is proportional to $\theta/\sin\theta$.

21. The apparatus of claim 15, wherein the axisymmetric projection-lens system comprises:

a projection lens for converging the charged-particle beam that passes through the mask pattern to cause the charged-particle beam to form a pattern image at a second crossover; and an objective lens positioned downstream of the projection lens for reducing the pattern image formed by the charged-particle beam by a magnification of less than unity.

22. The apparatus of claim 21, wherein each of the projection lens and the objective lens comprises a conductive electrode situated symmetrically about the optical axis, the conductive electrodes being adapted to receive respective electric potentials for controlling a focal point of the projection-lens system.

23. The apparatus of claim 22, further comprising a controller connected to the charged-particle-beam source for changing the current density of the charged-particle beam in response to a change in feature density of the mask.

24. The apparatus of claim 23, wherein the controller increases the charged-particle-beam current density in mask areas of low feature density and increases the charged-particle-beam current density in mask areas of high feature density.

25. The apparatus of claim 22, wherein the conductive electrodes in the projection lens and in the objective lens are operable to adjust the focal point of the projection-lens system in response to changes in the charged-particle beam current density based on the feature density of the mask.

26. The apparatus of claim 21, further comprising an astigmatism-correction coil positioned around the second crossover for correcting astigmatism in the charged-particle beam that has passed through the mask pattern, the astigmatism-correction coil being asymmetric with respect to the optical axis.

27. The apparatus of claim 15, wherein the transverse profile width of the charged-particle beam in the scanning direction is shaped to compensate for a non-uniform intensity distribution.

28. The apparatus of claim 27, wherein the transverse profile width of the charged-particle beam in the scanning direction narrows in a middle thereof.

29. A charged-particle beam projection-microlithography apparatus for transferring a mask pattern image to a substrate using a scanning charged-particle beam, the apparatus comprising along an optical axis in the trajectory direction of the charged-particle beam:

(a) a source of a charged-particle beam having a non-uniform intensity distribution in a direction perpendicular to the optical axis and a charged-particle-beam scanning direction;

(b) a beam shaper defining an aperture through which the charged-particle beam passes, the aperture including an edge, extending in the direction perpendicular to the optical axis and the scanning direction, shaped to compensate for the non-uniform intensity distribution;

(c) a scanner positioned between the beam shaper and a mask for deflecting the charged-particle beam so that the beam scans the scan fields of the mask pattern in the scanning direction; and (d) an axisymmetric projection-lens system positioned downstream of the mask for converging the charged-particle beam that passes through the mask pattern to form an image of the mask pattern on the substrate.

30. The apparatus of claim 29, wherein the edge of the aperture is concave.

31. The apparatus of claim 29, further comprising a mask stage for holding the mask, and a substrate stage for holding the substrate, the mask stage and the wafer stage being synchronously movable in a direction perpendicular to the scanning direction.

32. The apparatus of claim 29, further comprising a mask pattern divided into a plurality of rectangular scan fields having long edges extending in the scanning direction and short edges extending in a direction perpendicular to the scanning direction and the optical axis, and a non-feature area extending the length of each scan field long edge, wherein the scanner deflects the charged-particle beam to scan each scan field in the scanning direction such that the non-feature areas of adjacent long edges of the scan fields overlap on the wafer.

* * * * *